United States Patent
Chiu

(10) Patent No.: US 11,482,490 B1
(45) Date of Patent: Oct. 25, 2022

(54) SEMICONDUCTOR DEVICE WITH BRANCH TYPE PROGRAMMABLE STRUCTURE AND METHOD FOR FABRICATING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 16 days.

(21) Appl. No.: 17/228,172

(22) Filed: Apr. 12, 2021

(51) Int. Cl.
 *H01L 23/525* (2006.01)
(52) U.S. Cl.
 CPC .............................. *H01L 23/5252* (2013.01)
(58) Field of Classification Search
 CPC .................................................. H01L 23/5252
 USPC ........................................................ 257/530
 See application file for complete search history.

(56) References Cited

U.S. PATENT DOCUMENTS

| | | | |
|---|---|---|---|
| 11,107,730 B1 * | 8/2021 | Chiu | H01L 21/76831 |
| 2014/0332749 A1 * | 11/2014 | Yokoyama | H01L 43/02 257/288 |
| 2021/0343695 A1 * | 11/2021 | Chiu | H01L 23/528 |

* cited by examiner

*Primary Examiner* — Ajay Arora
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first electrode including a first vertical column, and a first bottom branch unit at a first vertical level and including a first set of bottom plates extending from the first vertical column and parallel to a first direction; two second electrodes respectively including a second vertical column, and a second bottom branch unit at a second vertical level higher than the first vertical level and including a first set of bottom plates extending from the second vertical column and parallel to the first direction; and a first insulation layer positioned between the first and second bottom branch unit. The first sets of bottom plates of the first and second bottom branch unit are partially overlapped. The first insulation layer and the first and second electrode together configure a programmable structure.

20 Claims, 37 Drawing Sheets

SEMICONDUCTOR DEVICE WITH BRANCH TYPE PROGRAMMABLE STRUCTURE AND METHOD FOR FABRICATING THE SAME

TECHNICAL FIELD

The present disclosure relates to a semiconductor device and a method for fabricating the semiconductor device, and more particularly, to a semiconductor device with a branch type programmable structure and a method for fabricating the semiconductor device the branch type programmable structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first electrode including a first vertical column, and a first bottom branch unit positioned at a first vertical level and including a first set of bottom plates extending from two opposing sides of the first vertical column and parallel to a first direction; two second electrodes disposed at two sides of the first electrode and respectively including a second vertical column, and a second bottom branch unit positioned at a second vertical level higher than the first vertical level and including a first set of bottom plates extending from two opposing sides of the second vertical column and parallel to the first direction; and a first insulation layer positioned between the first bottom branch unit and the second bottom branch unit. The first set of bottom plates of the first bottom branch unit and the first set of bottom plates of the second bottom branch unit are partially overlapped in a top-view perspective. The first electrode, the first insulation layer, and the second electrode together configure a programmable structure.

In some embodiments, the first vertical column includes a plurality of first connection vias and a center plate of the first bottom branch unit stacked vertically, and the first set of bottom plates of the first bottom branch unit are extending from the center plate of the first bottom branch unit.

In some embodiments, a shape of the center plate of the first bottom branch unit is triangle, square, rectangular, polygon, circle, or oval in a top-view perspective.

In some embodiments, the first insulation layer is an etch stop layer.

In some embodiments, the first set of bottom plates includes tungsten, cobalt, zirconium, tantalum, titanium, aluminum, ruthenium, copper, metal carbides, metal nitrides, transition metal aluminides, or a combination thereof.

In some embodiments, the first insulation layer includes silicon oxide, silicon nitride, silicon oxynitride, silicon nitride oxide, or a combination thereof.

Another aspect of the present disclosure provides a semiconductor device including two first electrodes diagonally arranged, two second electrode diagonally arranged, and a first insulation layer. The two first electrodes respectively include a first vertical column and a first bottom branch unit positioned at a first vertical level. The first bottom branch unit includes a first set of bottom plates extending from two opposing sides of the first vertical column and parallel to a first direction, and a second set of bottom plates extending from other two opposing sides of the first vertical column and parallel to a second direction perpendicular to the first direction. The two second electrode respectively include a second vertical column and a second bottom branch unit positioned at a second vertical level higher than the first vertical level. The second bottom branch unit includes a first set of bottom plates extending from two opposing sides of the second vertical column and parallel to the first direction, and a second set of bottom plates extending from other two opposing sides of the second vertical column and parallel to the second direction. The first insulation layer is positioned between the first bottom branch unit and the second bottom branch unit. The first sets of bottom plates of the first bottom branch unit and the second bottom branch unit are partially overlapped in a top-view perspective, and the second sets of bottom plates of the first bottom branch unit and the second bottom branch unit are partially overlapped in the top-view perspective. The first electrode, the second electrode, and the first insulation layer together configure a programmable structure.

In some embodiments, the two first electrodes respectively include a first top branch unit positioned at a third vertical level higher than the second vertical level. The first top branch unit includes a first set of top plates extending from other two opposing sides of the first vertical column and parallel to a third direction slanted with respective to the first direction and the second direction, and a second set of top plates extending from other two opposing sides of the first vertical column and parallel to a fourth direction perpendicular to the third direction.

In some embodiments, the semiconductor device includes a third electrode and a second insulation layer. The third electrode includes a third vertical column and a first middle branch unit positioned at a fourth vertical level. The first middle branch unit includes a first set of middle plates extending from two opposing sides of the third vertical column and parallel to the third direction. The fourth vertical level is higher than the third vertical level. The first set of middle plates of the first middle branch unit and the first set of top plates of the first top branch unit are partially overlapped in the top-view perspective. The second insulation layer is positioned between the first top branch unit and the first middle branch unit.

In some embodiments, the first middle branch unit includes a second set of middle plates extending from other two opposing sides of the third vertical column and parallel to the fourth direction.

In some embodiments, the semiconductor device includes a third insulation layer. The two second electrodes respectively include a second top branch unit positioned at a fifth vertical level. The second top branch unit includes a first set of top plates extending from other two opposing sides of the second vertical column and parallel to the third direction, and a second set of top plates extending from other two opposing sides of the second vertical column and parallel to the fourth direction. The fifth vertical level is higher than the fourth vertical level. The second set of top plates of the second top branch unit and the second set of middle plates of the first middle branch unit are partially overlapped in the top-view perspective. The third insulation layer is positioned between the second top branch unit and the first middle branch unit.

In some embodiments, the semiconductor device includes a fourth electrode including a fourth vertical column and a second middle branch unit positioned at a same vertical level as the first middle branch unit. The second middle branch unit includes a first set of middle plates extending from two opposing sides of the fourth vertical column and parallel to the third direction. The first set of middle plates of the second middle branch unit and the first set of top plates of the second top branch unit are partially overlapped in the top-view perspective. The third insulation layer is positioned between the second top branch unit and the second middle branch unit.

In some embodiments, the second middle branch unit includes a second set of middle plates extending from other two opposing sides of the fourth vertical column and parallel to the fourth direction. The second set of middle plates of the second middle branch unit and the second set of top plates of the first top branch unit are partially overlapped in the top-view perspective. The second insulation layer is positioned between the first top branch unit and the second middle branch unit.

In some embodiments, a bottom surface of the second vertical column contacts a substrate.

In some embodiments, a bottom surface of the third vertical column is at a vertical level higher than a vertical level of a bottom surface of the first vertical column.

In some embodiments, a bottom surface of the third vertical column contacts a substrate.

Another aspect of the present disclosure provides a method for fabricating a semiconductor device including forming a plurality of first bottom branch units at a first vertical level, forming a first insulation layer to cover the plurality of first bottom branch unit, and forming a plurality of second bottom branch units on the first insulation layer and at a second vertical higher than the first vertical level. The plurality of first bottom branch units respectively include a first vertical column and a first set of bottom plates extending from two sides of the first vertical column and parallel to a first direction. The plurality of second bottom branch units respectively include a second vertical column and a first set of bottom plates extending from two sides of the second vertical column, parallel to the first direction, and partially overlapped with the first set of bottom plates of the first bottom branch unit in a top-view perspective to configure a programmable structure.

In some embodiments, the plurality of first bottom branch units respectively include a second set of bottom plates extending from other two sides of the first vertical column and parallel to a second direction perpendicular to the first direction. The plurality of second bottom branch units respectively includes a second set of bottom plates extending from other two sides of the second vertical column, parallel to the second direction, and partially overlapped with the second set of bottom plates of the first bottom branch unit in the top-view perspective to configure another programmable structure.

In some embodiments, the method for fabricating the semiconductor device includes forming a plurality of first top branch units above the plurality of first bottom branch units, at a third vertical level higher than the second vertical level, and electrically coupled to the plurality of the first bottom branch units. The plurality of first top branch units respectively include a first set of top plates extending from other two sides of the first vertical column and parallel to a third direction slanted with respect to the first direction.

In some embodiments, the method for fabricating the semiconductor device includes forming a second insulation layer to cover the plurality of first top branch units, and forming a plurality of first middle branch unit on the second insulation layer and at a fourth vertical level higher than the third vertical level. The plurality of first middle branch units respectively include a third vertical column, and a first set of middle plates extending from two sides of the third vertical column, parallel to the third direction, and partially overlapped with the first set of top plates of the first top branch unit in the top-view perspective to configure another programmable structure.

Due to the design of the semiconductor device of the present disclosure, each electrode may provide multiple programmable configurations within limited wafer area by branch type programmable structure. As a result, the real estate of the semiconductor device may be saved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
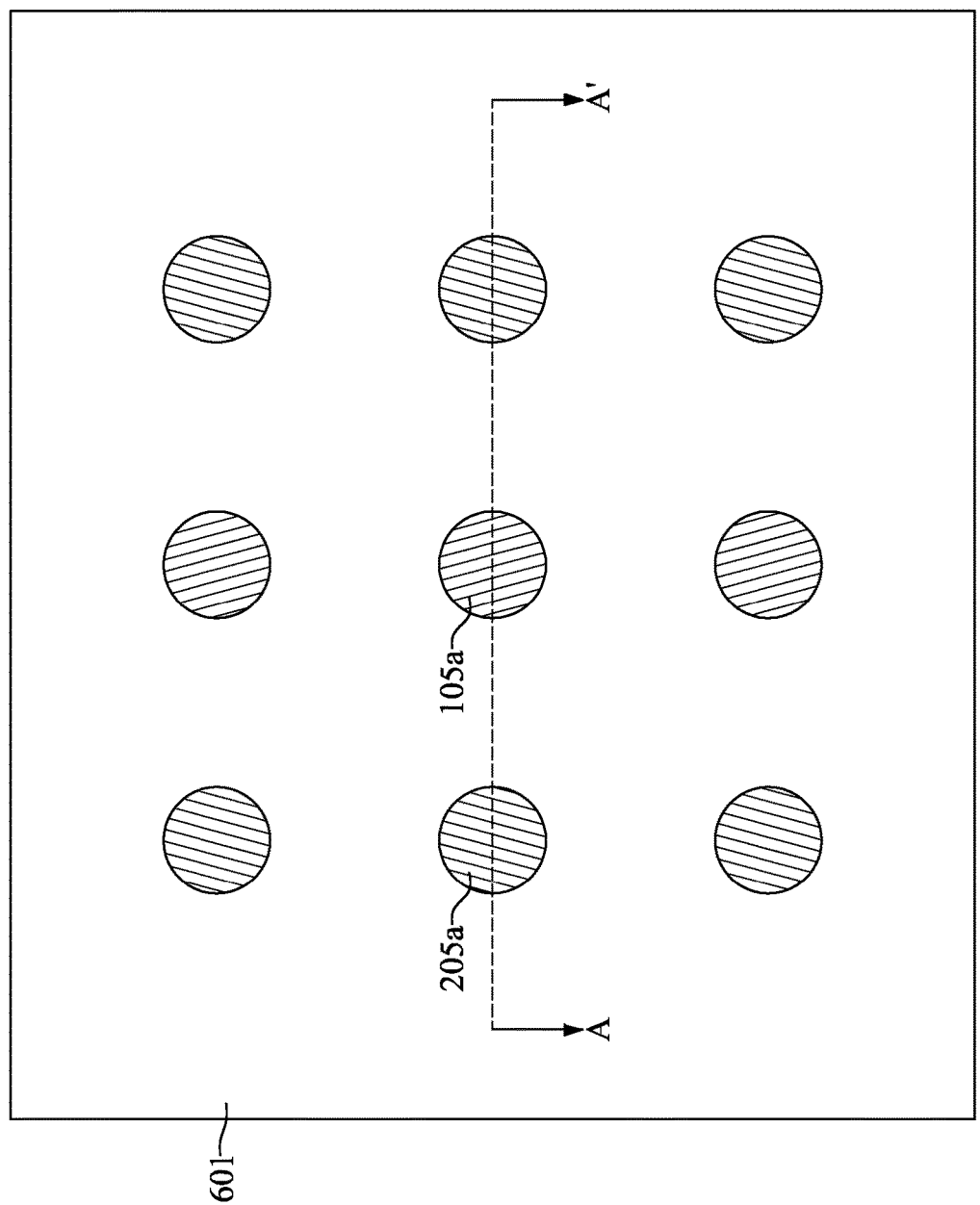
FIG. 1 illustrates, in a schematic top-view diagram, part of a flow for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, an x-y-z coordinate system is assumed where x and y refer to dimensions within the plane parallel to the major surface of the structure and z refers a dimension perpendicular to the plane.

It should be noted that, in the description of the present disclosure, above (or up) corresponds to the direction of the arrow of the dimension Z, and below (or down) corresponds to the opposite direction of the arrow of the dimension Z.

Figure 2:
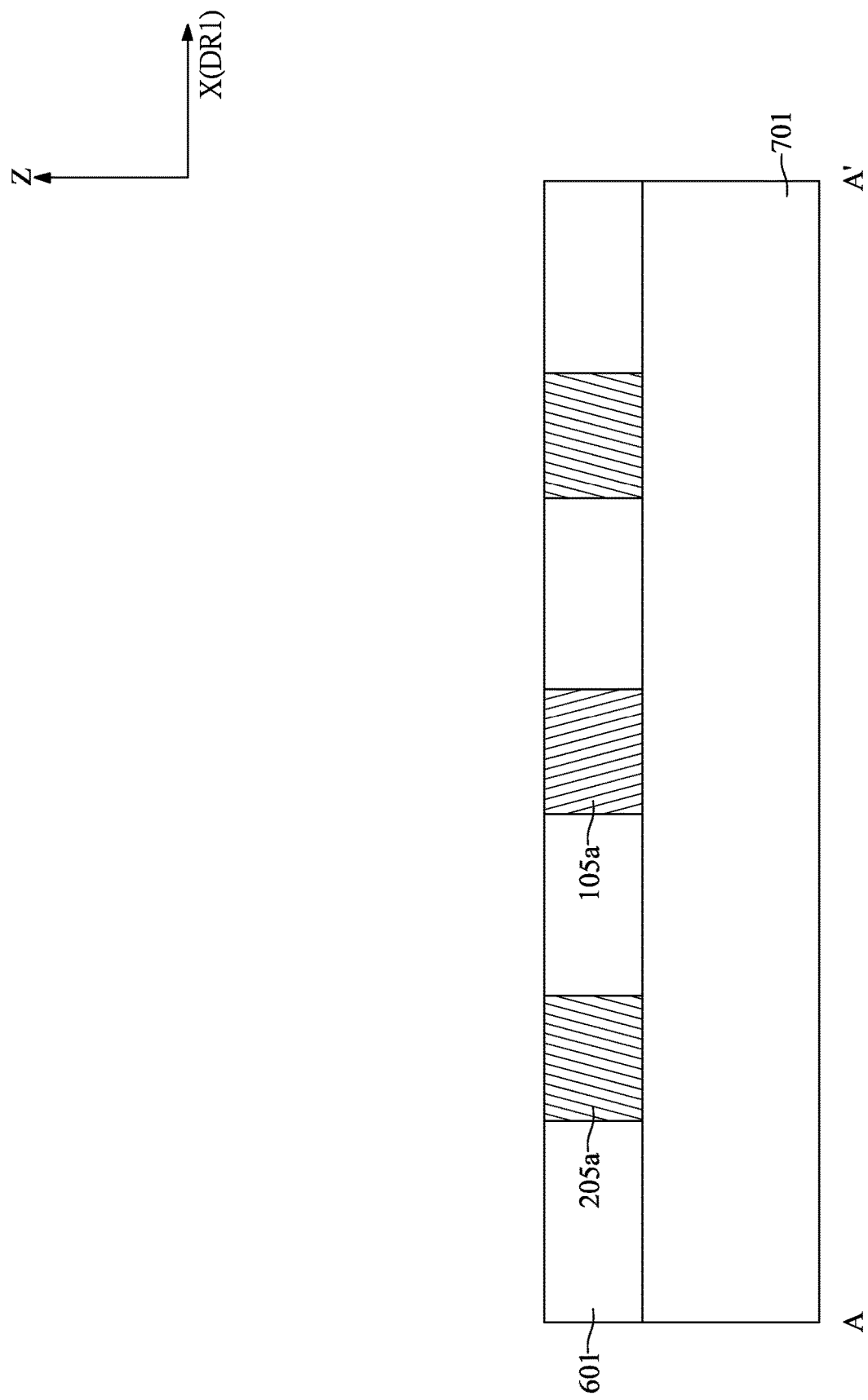
FIG. 2 is a schematic cross-sectional view diagram taken along a line A-A' in FIG. 1.

FIG. 1 illustrates, in a schematic top-view diagram, part of a flow for fabricating a semiconductor device 1A in accordance with one embodiment of the present disclosure. FIG. 2 is a schematic cross-sectional view diagram taken along a line A-A' in FIG. 1.

With reference to FIGS. 1 and 2, a substrate 701 may be provided. The substrate 701 may be formed of, for example, an elementary semiconductor, such as silicon or germanium or a compound semiconductor, such as silicon germanium.

With reference to FIGS. 1 and 2, the dielectric layer 601 may be formed on the substrate 701 and may be formed of, for example, silicon oxide, borophosphosilicate glass, undoped silicate glass, fluorinated silicate glass, low-k dielectric materials, the like, or a combination thereof.

In a cross-sectional perspective, a plurality of first connection vias 105a and a plurality of second connection vias 205a may be formed on the substrate 701 and in the dielectric layer 601. In a top-view perspective, the first connection vias 105a and the second connection vias 205a may be alternatively arranged along the dimension X. The dimension X may be also referred to as the first direction DR1. The first connection vias 105a may be arranged along the dimension Y and may be separated from each other. The second connection vias 205a may be arranged along the dimension Y and may be separated from each other. The dimension Y may be also referred to as the second direction DR2. In some embodiments, the first connection vias 105a and the second connection vias 205a may be formed in a peripheral region of the substrate 701 or a redundant region of the substrate 701.

A plurality of device elements (not shown) may be formed on the substrate 701 and in the dielectric layer 603. The device elements may be transistors such as complementary metal-oxide-semiconductor transistors, metal-oxide-semiconductor field-effect transistors, fin field-effect-transistors, the like, or a combination thereof. The device elements may be electrically coupled to form functional units. A functional unit, in the description of the present disclosure, generally refers to functionally related logic circuitry that has been partitioned for functional purposes into a distinct unit. The functional units may be formed in a center region of the substrate 701. In some embodiments, the functional units may be electrically coupled to the first connection vias 105a and the second connection vias 205a. In some embodiments, the first connection vias 105a and the second connection vias 205a may be grounded.

Figure 3:
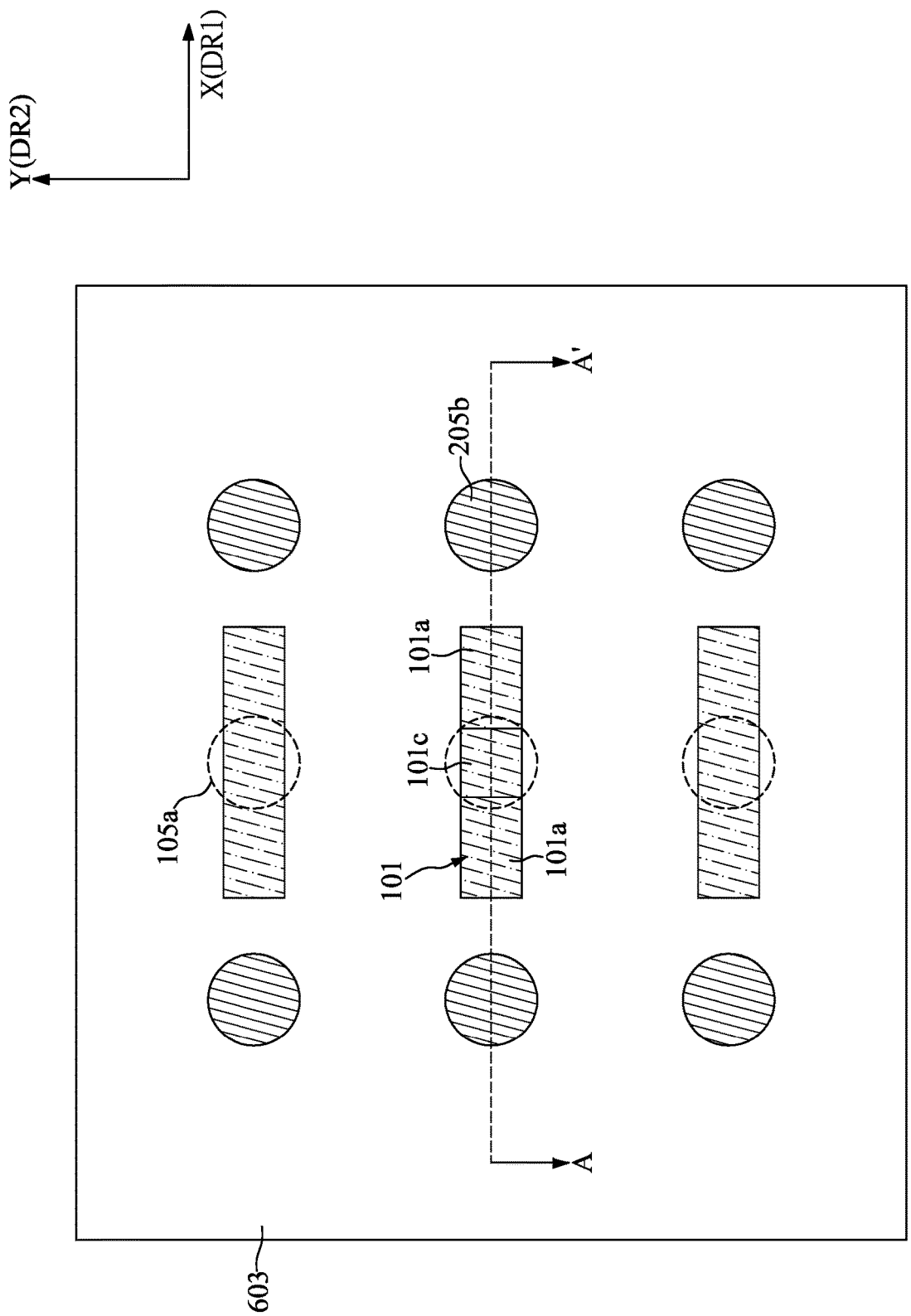
FIG. 3 illustrates, in a schematic top-view diagram, part of the flow for fabricating the semiconductor device in accordance with one embodiment of the present disclosure.
Figure 4:
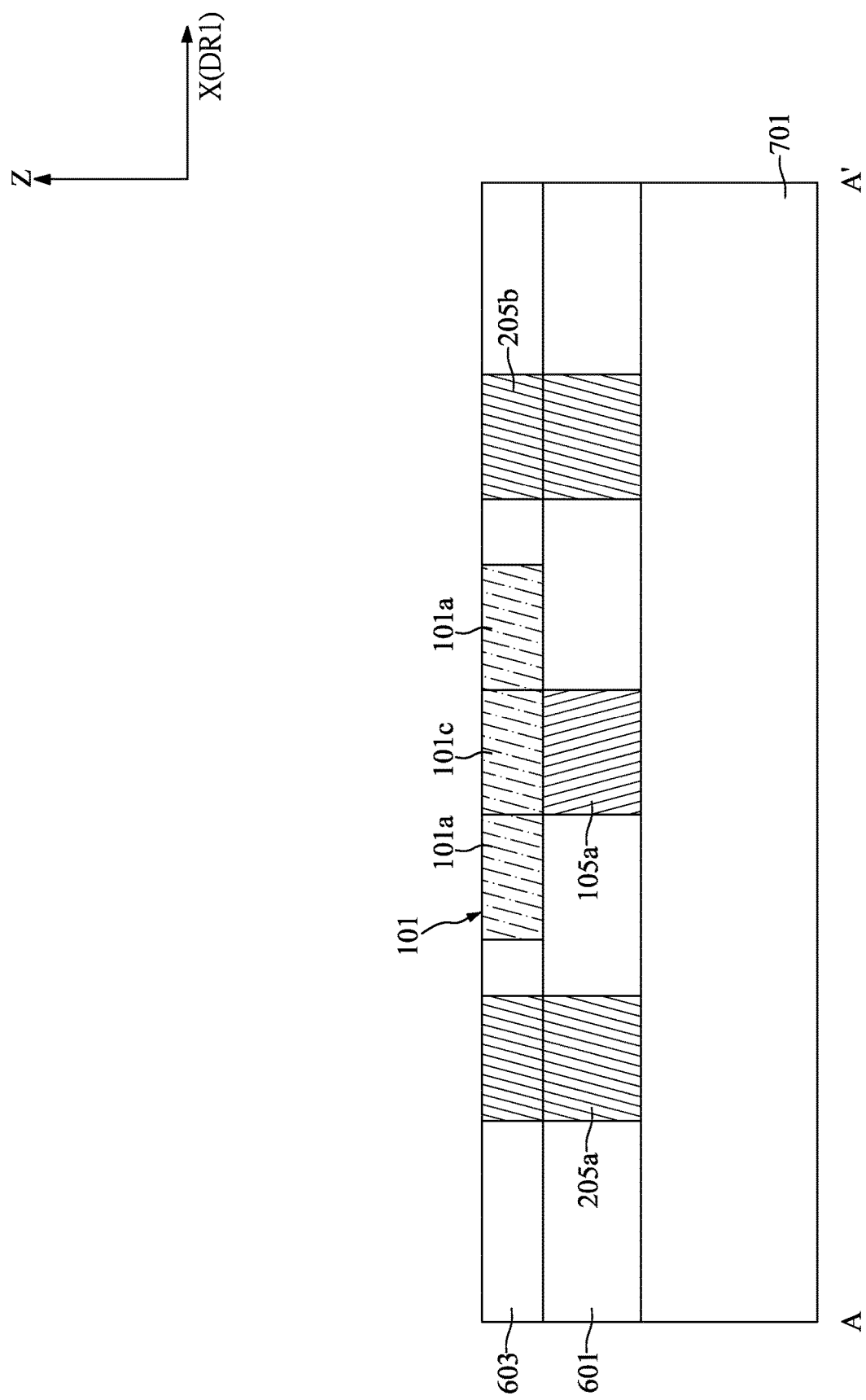
FIG. 4 is a schematic cross-sectional view diagram taken along a line A-A' in FIG. 3.

FIG. 3 illustrates, in a schematic top-view diagram, part of the flow for fabricating the semiconductor device 1A in accordance with one embodiment of the present disclosure. FIG. 4 is a schematic cross-sectional view diagram taken along a line A-A' in FIG. 3.

With reference to FIGS. 3 and 4, a dielectric layer 603 may be formed on the dielectric layer 601. A plurality of second connection vias 205b may be respectively correspondingly formed on the second connection vias 205a and in the dielectric layer 603.

A plurality of first bottom branch units 101 may be respectively correspondingly formed on the first connection vias 105a. For brevity, clarity, and convenience of description, only one first bottom branch unit 101 is described. The first bottom branch unit 101 may be formed at a first vertical level and may include a center plate 101c and a first set of bottom plates 101a. The center plate 101c may be formed on the first connection via 105a. The first set of bottom plates 101a may be formed extending from two sides of the center plate 101c and parallel to the first direction DR1. In some embodiments, the first set of bottom plates 101a may be extending from the center plate 101c and extending along two directions intersected with each other.

It should be noted that, in FIGS. 3 and 4, only one center plate 101c is shown in the first bottom branch units 101 for clarity.

Figure 5:
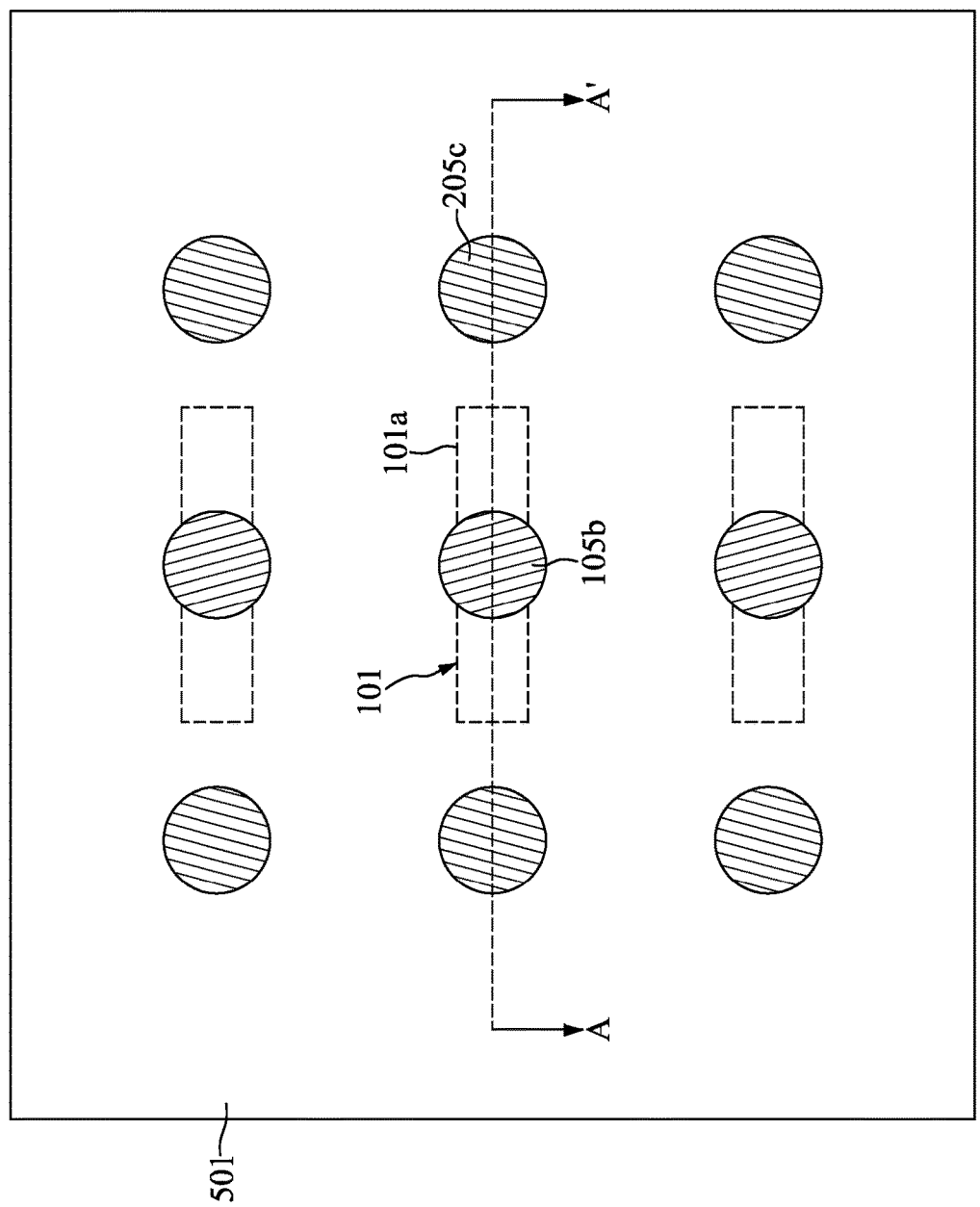
FIG. 5 illustrates, in a schematic top-view diagram, part of the flow for fabricating the semiconductor device in accordance with one embodiment of the present disclosure.
Figure 6:
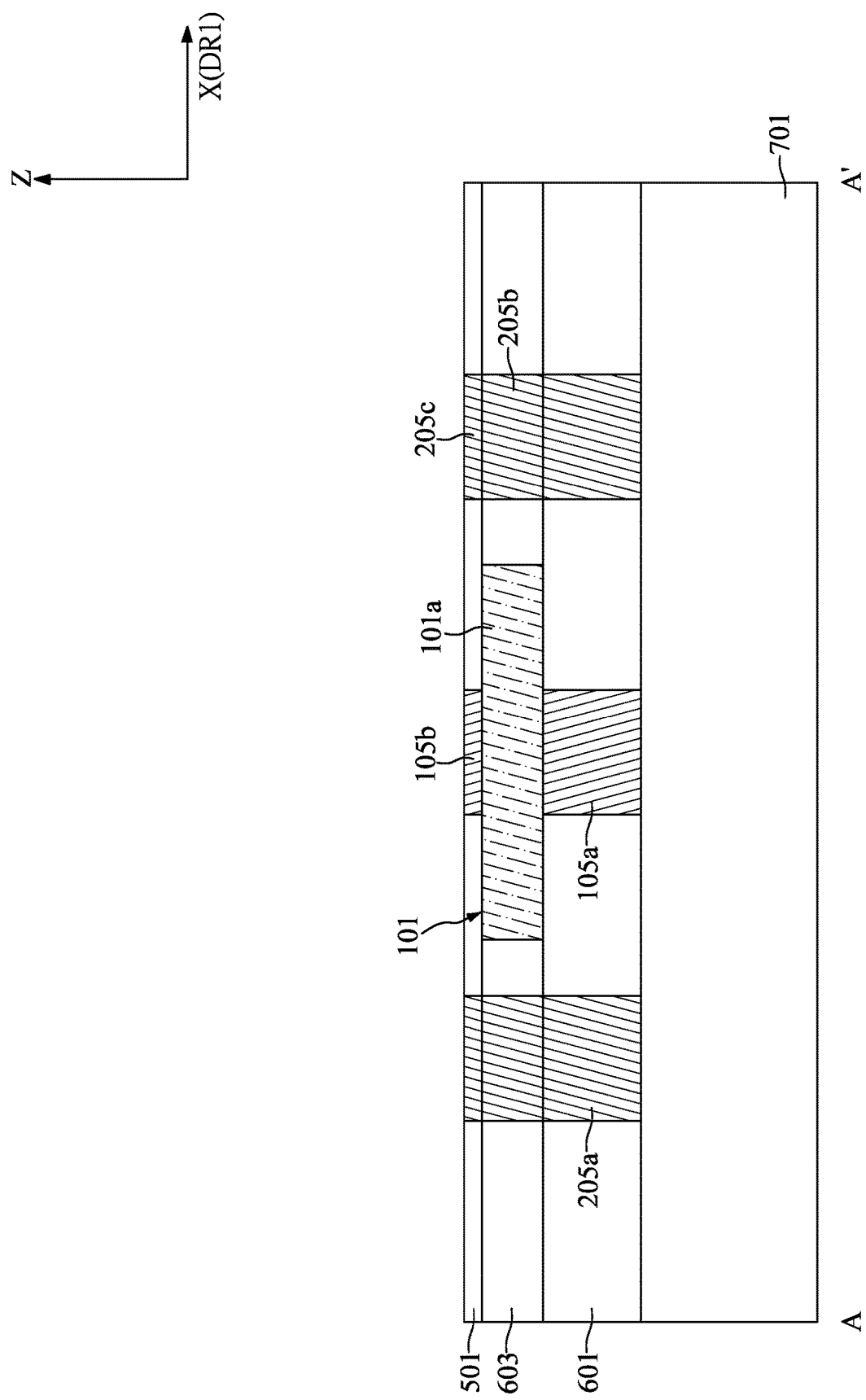
FIG. 6 is a schematic cross-sectional view diagram taken along a line A-A' in FIG. 5.

FIG. 5 illustrates, in a schematic top-view diagram, part of the flow for fabricating the semiconductor device 1A in accordance with one embodiment of the present disclosure. FIG. 6 is a schematic cross-sectional view diagram taken along a line A-A' in FIG. 5.

With reference to FIGS. 5 and 6, a first insulation layer 501 may be formed on the dielectric layer 603 to cover the first bottom branch unit 101 and the second connection via 205b. The first insulation layer 501 may have a thickness between about 30 angstroms and about 50 angstroms. In some embodiments, the first insulation layer 501 may be formed of, for example, silicon oxide, silicon nitride, silicon oxynitride, silicon nitride oxide, or a combination thereof. In some embodiments, the first insulation layer 501 may be formed of, for example, silicon nitride, carbon-doped oxide, carbon incorporated silicon oxide, nitrogen-doped silicon carbide, or silicon-oxycarbide. In some embodiments, the first insulation layer 501 may be an etch stop layer and may be easily integrated into middle-end-of line process or back-end-of-line process.

With reference to FIGS. 5 and 6, a plurality of first connection vias 105b may be respectively correspondingly formed on the center plates 101c of the first bottom branch units 101. A plurality of second connection vias 205c may be respectively correspondingly formed on the second connection vias 205b. In some embodiments, the second connection vias 205a, 205b, 205c may have shapes such as circle, oval, triangle, square, rectangle, diamond, parallelogram, polygon, or other suitable shape in a top-view perspective. The second connection vias 205a, 205b, 205c may have different shapes from each other. In some embodiments, the second connection vias 205a, 205b, 205c may all have a same shape. In some embodiments, the second connection vias 205a, 205b, 205c may have different horizontal cross-sectional areas. In some embodiments, the second connection vias 205a, 205b, 205c may all have a same horizontal cross-sectional area. In the description of the present disclosure, a horizontal cross-sectional area indicates that an area of a feature (or element) parallel to the x-y plane.

Figure 7:
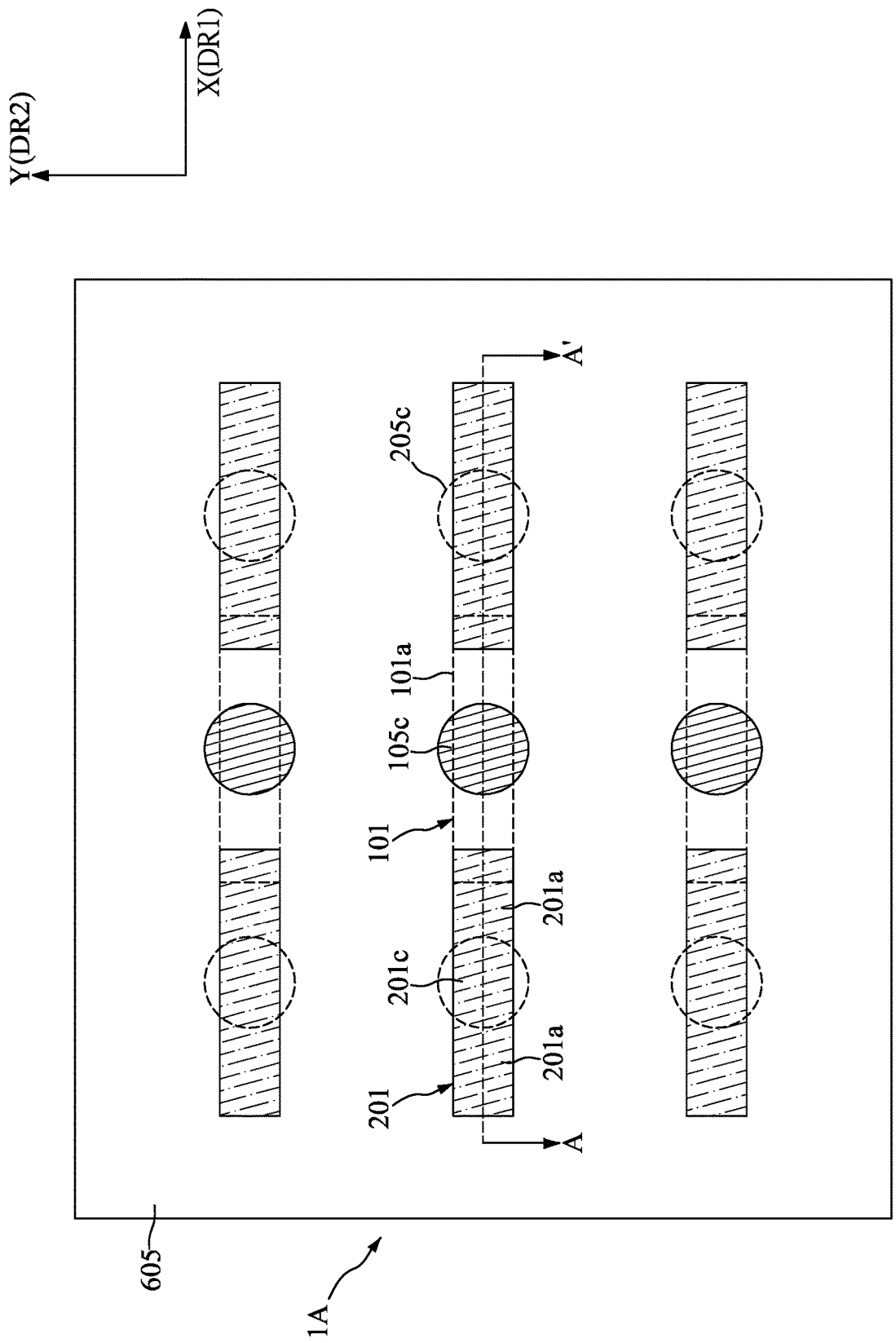
FIG. 7 illustrates, in a schematic top-view diagram, part of the flow for fabricating the semiconductor device in accordance with one embodiment of the present disclosure.
Figure 8:
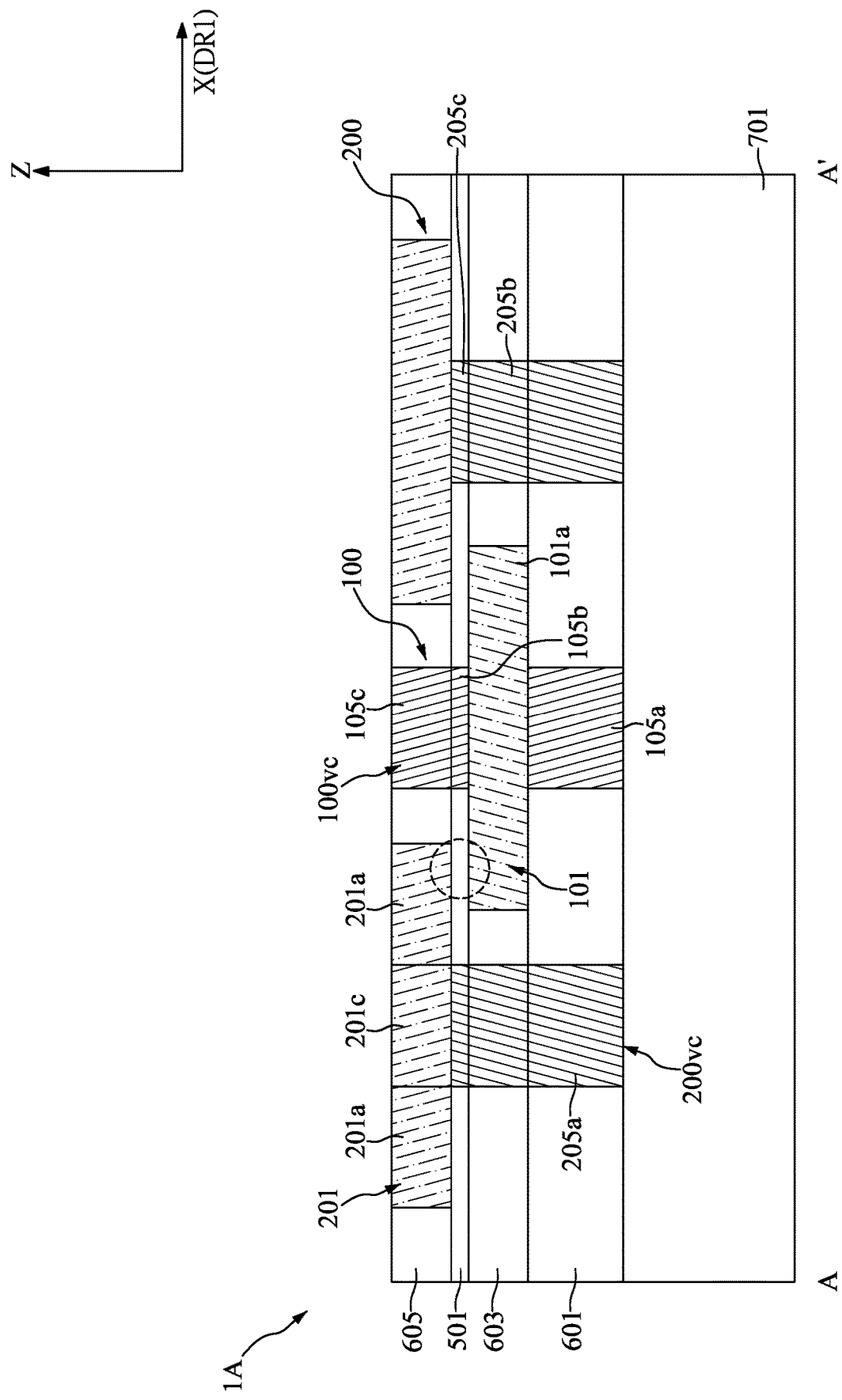
FIG. 8 is a schematic cross-sectional view diagram taken along a line A-A' in FIG. 7.

FIG. 7 illustrates, in a schematic top-view diagram, part of the flow for fabricating the semiconductor device 1A in accordance with one embodiment of the present disclosure. FIG. 8 is a schematic cross-sectional view diagram taken along a line A-A' in FIG. 7.

With reference to FIGS. 7 and 8, a dielectric layer 605 may be formed on the first insulation layer 501 and covering the first connection vias 105b and the second connection vias 205c. A plurality of first connection vias 105c may be respectively correspondingly formed on the first connection vias 105b and in the dielectric layer 605. The first connection vias 105a, 105b, 105c and the center plate 101c of the center plate 101c together configure a first vertical column 100vc. The first vertical column 100vc and the first set of bottom plates 101a of the first bottom branch unit 101 together configure a first electrode 100.

In some embodiments, the first connection vias 105a, 105b, 105c may have different shapes from each other. In some embodiments, the first connection vias 105a, 105b, 105c may all have a same shape. In some embodiments, the first connection vias 105a, 105b, 105c may have different horizontal cross-sectional areas. In some embodiments, the first connection vias 105a, 105b, 105c may all have a same horizontal cross-sectional area.

With reference to FIGS. 7 and 8, a plurality of second bottom branch units 201 may be respectively correspondingly formed on the second connection vias 205c. For brevity, clarity, and convenience of description, only one second bottom branch unit 201 is described. The second bottom branch unit 201 may be formed at a second vertical level higher than the first vertical level. The second bottom branch unit 201 may include a center plate 201c and a first set of bottom plates 201a. The center plate 201c may be formed on the second connection via 205c. The center plate 201c and the second connection vias 205a, 205b, 205c together configure a second vertical column 200vc.

The first set of bottom plates 201a may be formed extending from two sides of the center plate 201c and parallel to the direction of the first set of bottom plates 101a of the first bottom branch unit 101. In other words, the first set of bottom plates 201a may be extending along the first direction DR1. The second vertical column 200vc and the first set of bottom plates 201a of the second bottom branch unit 201 together configure a second electrode 200.

The fabrication of the first bottom branch unit 101 and the second bottom branch unit 201 may be easily integrated with middle-end-of line process or back-end-of-line process. For example, the first bottom branch unit 101 and the second bottom branch unit 201 may be concurrently fabricated with inter-layer metals. That is, no extra process is need for fabricating the first bottom branch unit 101 and the second bottom branch unit 201.

It should be noted that, in FIGS. 7 and 8, only one center plate 201c is shown in the second bottom branch units 201 for clarity.

The first connection vias 105a, 105b, 105c, the second connection vias 205a, 205b, 205c, the first bottom branch units 101, and the second bottom branch units 201 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 7 and 8, the first set of bottom plates 201a of the second bottom branch unit 201 and the first set of bottom plates 101a of the first bottom branch unit 101 may be partially overlapped in a top-view perspective. The first insulation layer 501 is disposed between the first set of bottom plates 101a and the first set of bottom plates 201a in a cross-sectional perspective. The first insulation layer 501 and the overlapped first set of bottom plates 101a of the first electrode 100 and first set of bottom plates 201a of the second electrode 200 together configure a programmable structure.

With reference to FIG. 8, in a perspective of the first electrode 100, each side of the first set of bottom plates 101a has two programming states ("On" or "Off"). Therefore, total four (4) possible configurations may be employed for the first electrode 100. For example, during a programming procedure, a programming voltage may be provided and applied to the second electrode 200 on the left side, and the first electrode 100 and the second electrode 200 on the right side may be grounded. The first insulation layer 501 sandwiched by the first set of bottom plates 201a of the second electrode 200 on the left side and the first set of bottom plates 101a of the first electrode 100 (shown in dashed circle) may be stressed under the programming voltage. As a result, the sandwiched portion of the first insulation layer 501 may be ruptured to form a contiguous path connecting the first set of bottom plates 201a of the second electrode 200 on the left side and the first set of bottom plates 101a of the first electrode 100. In other words, the sandwiched portion of the first insulation layer 501 may be blown out (i.e., the programming state is "On"). In contrast, the first insulation layer 501 sandwiched by the first set of bottom plates 201a of the second electrode 200 on the right side and the first set of bottom plates 101a of the first electrode 100 may be still intact (i.e., the programming state is "Off").

Due to the branch type plates of the electrodes, even within limited wafer area, each electrode may still provide multiple programmable configurations. As a result, the real estate of the semiconductor device 1A may be saved.

Figure 9:
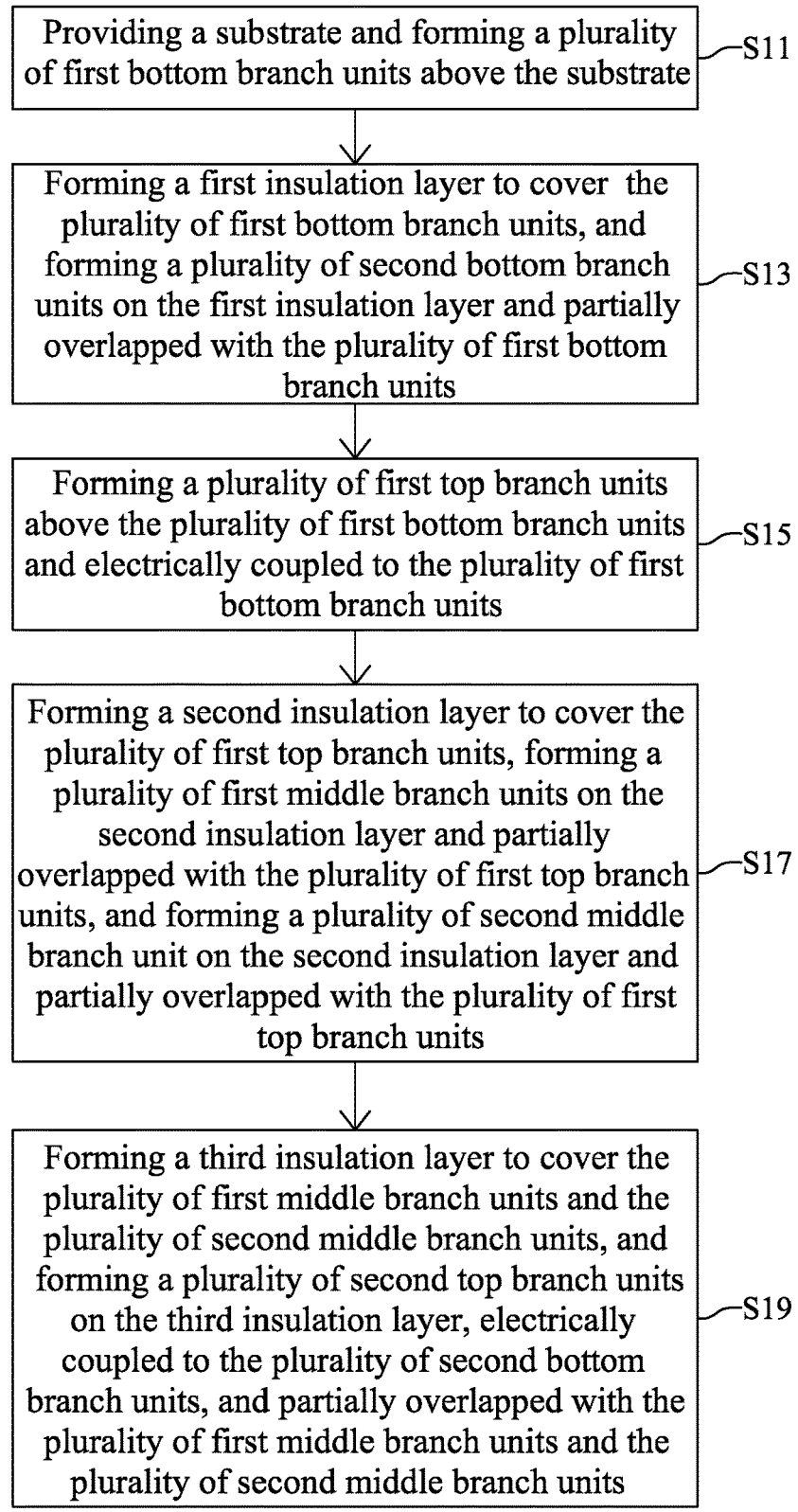
FIG. 9 illustrates, in a flowchart diagram form, a method for fabricating a semiconductor device in accordance with another embodiment of the present disclosure.
Figure 10:
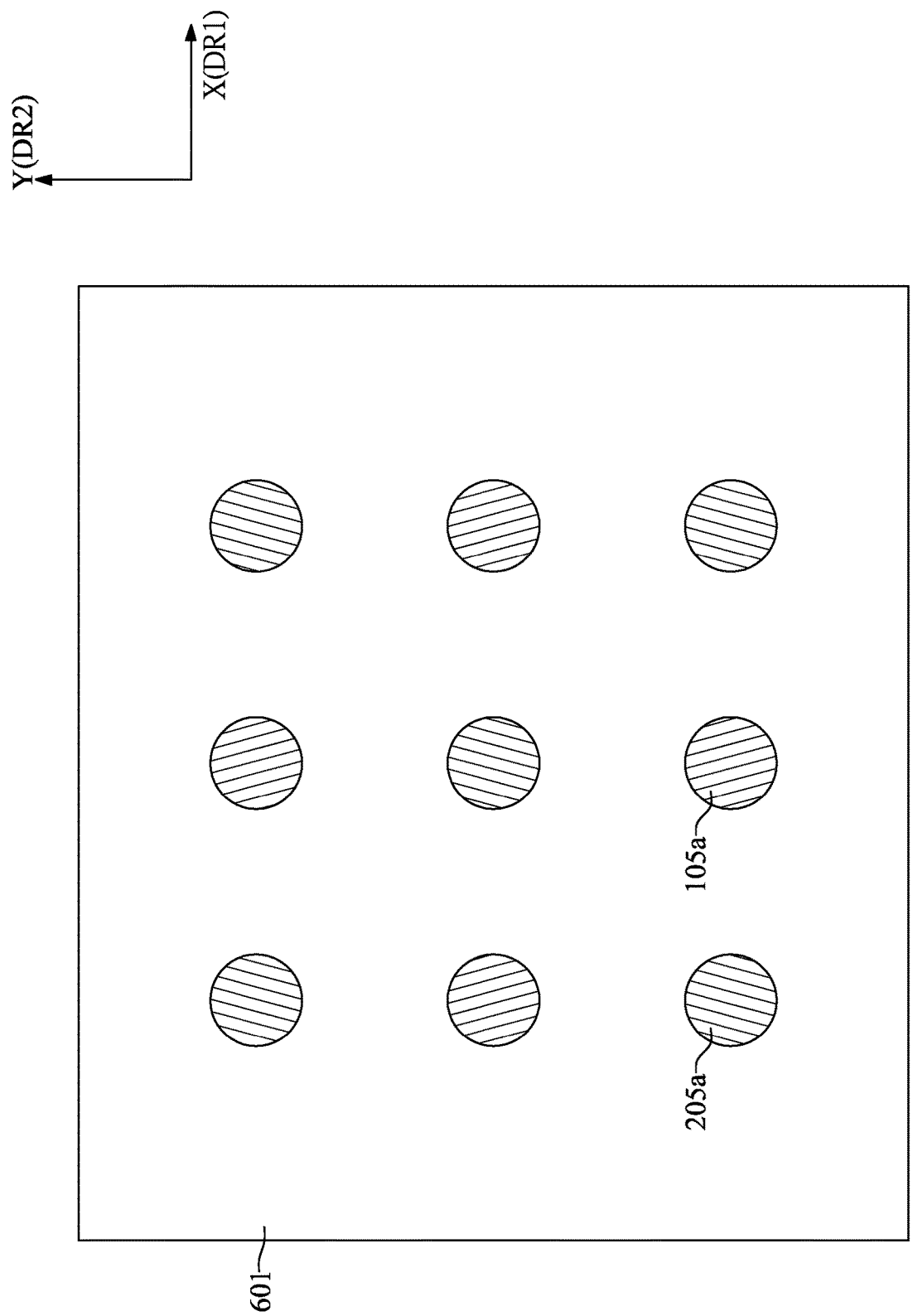
FIG. 10 illustrates, in a schematic top-view diagram, an intermediate semiconductor device in accordance with another embodiment of the present disclosure.
Figure 11:
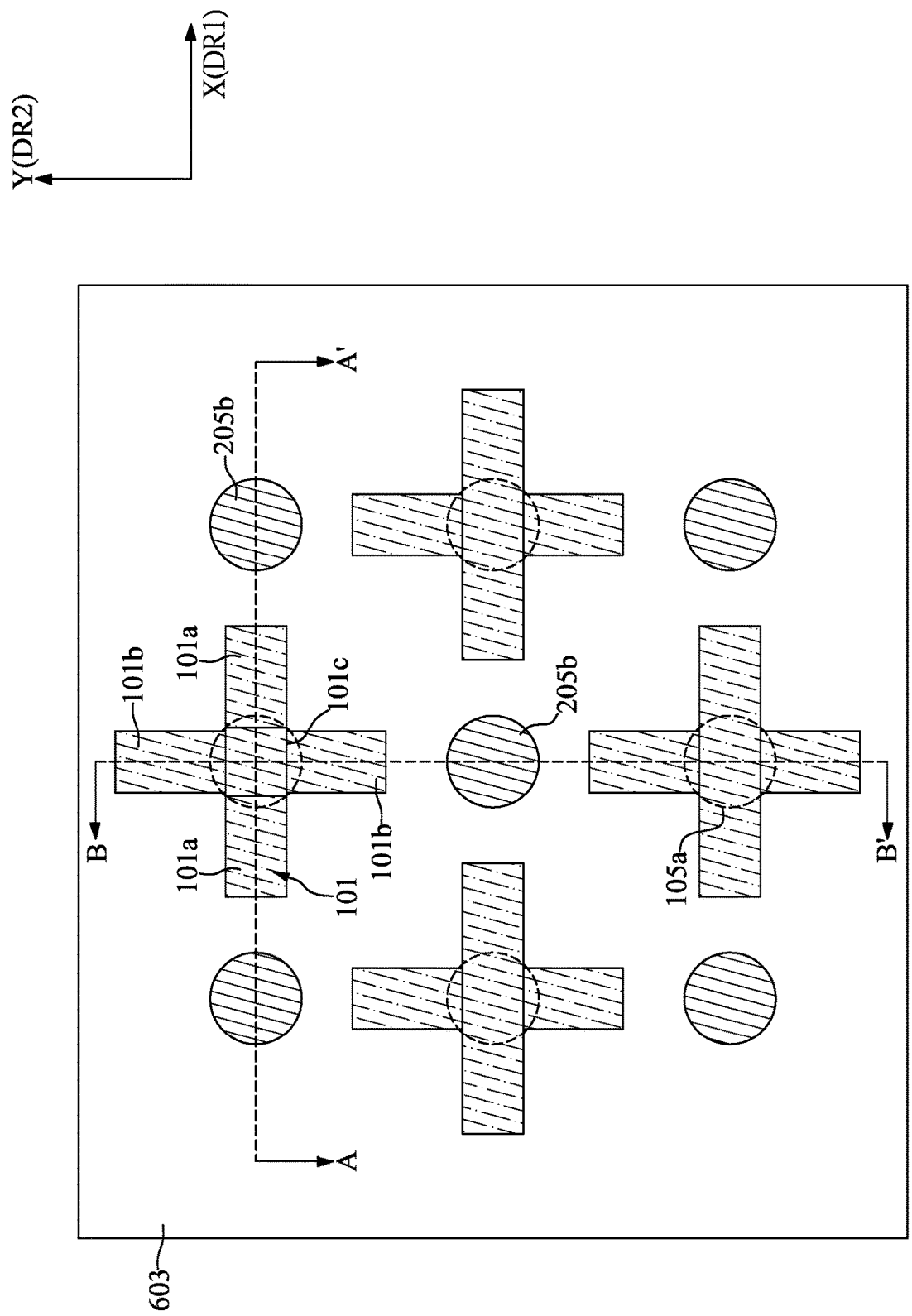
FIG. 11 illustrates, in a schematic top-view diagram, part of a flow for fabricating the semiconductor device in accordance with another embodiment of the present disclosure.
Figure 12:
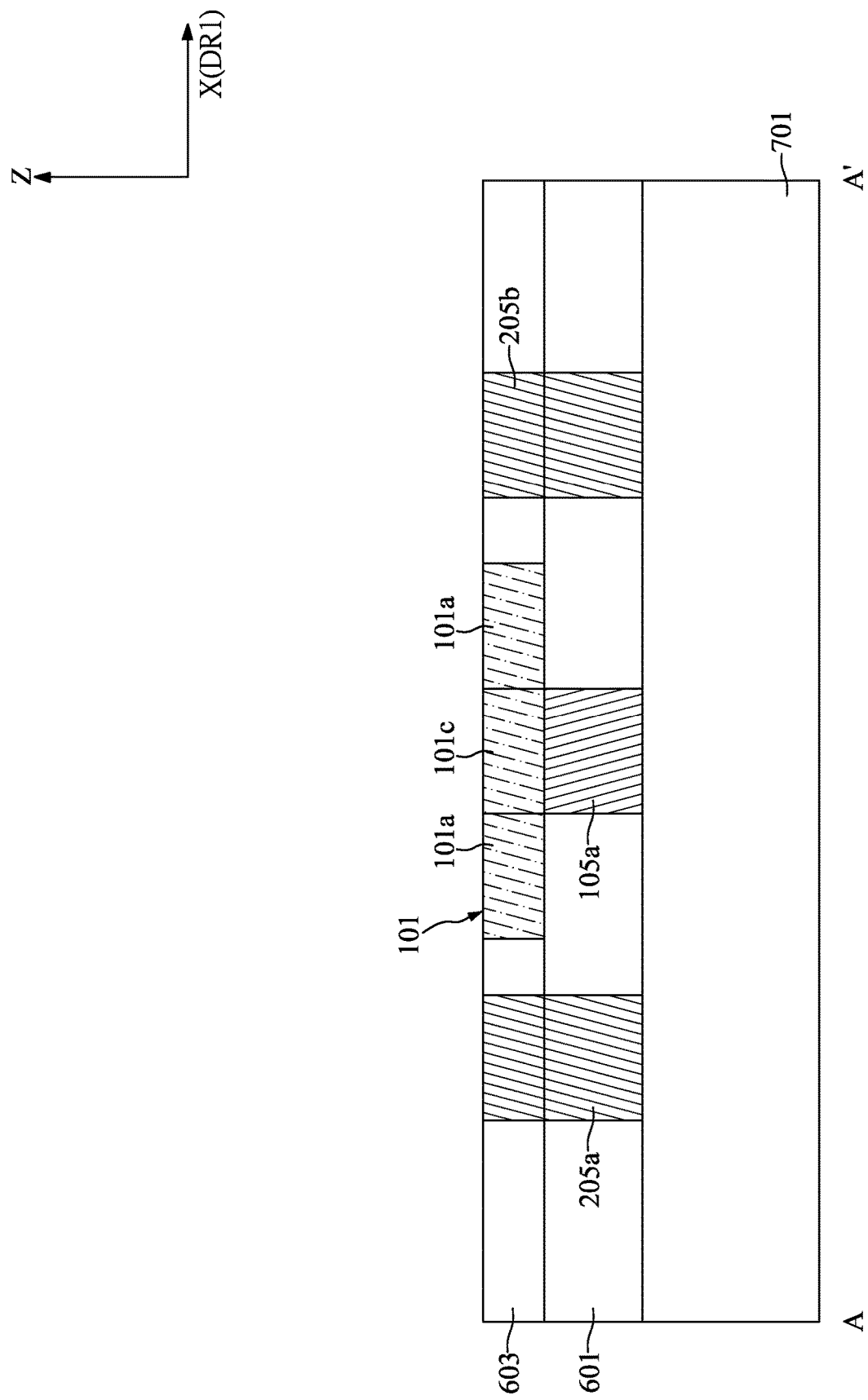
FIGS. 12 and 13 are schematic cross-sectional view diagrams respectively taken along lines A-A' and B-B' in FIG. 8.
Figure 13:
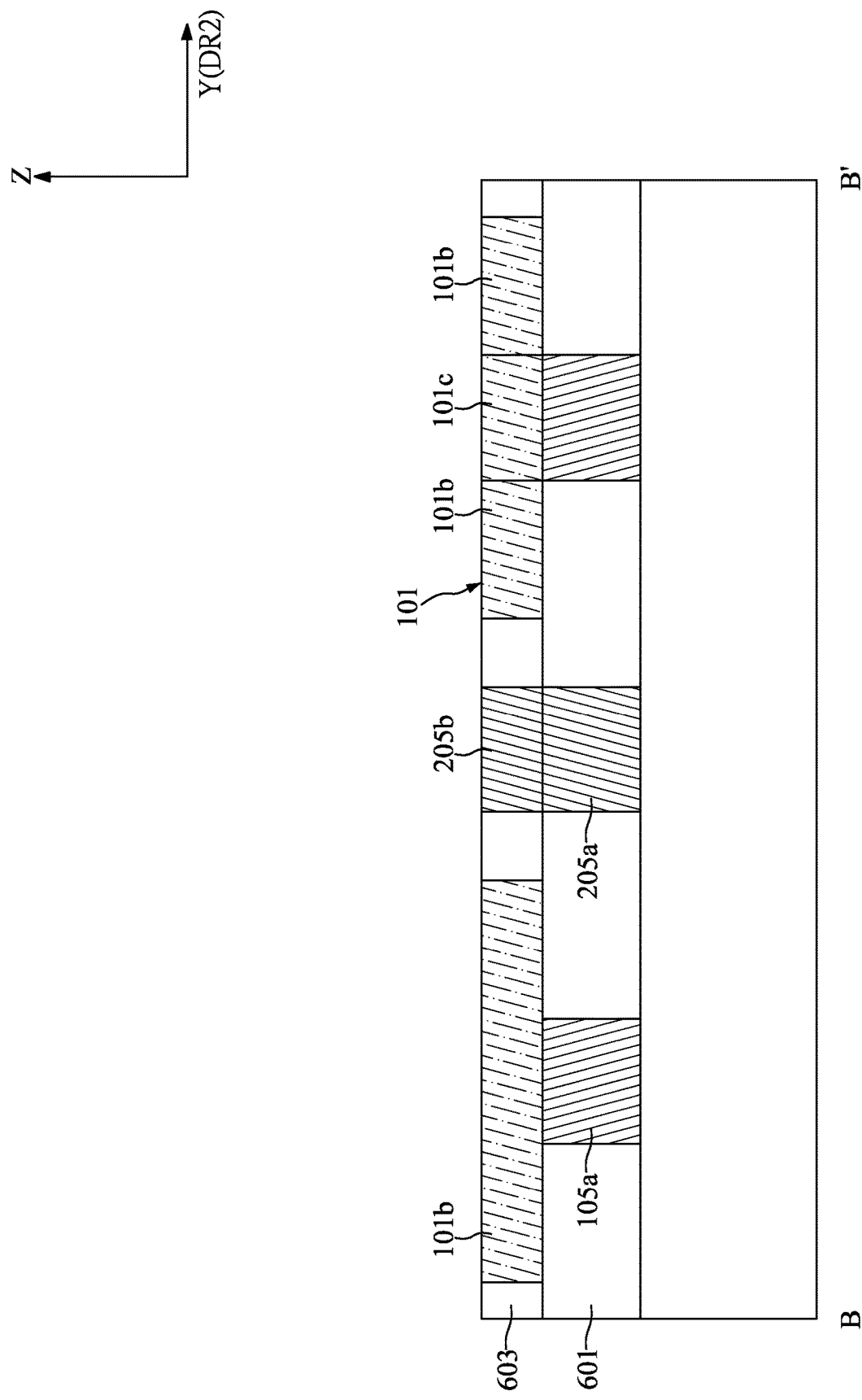

FIG. 9 illustrates, in a flowchart diagram form, a method 10 for fabricating a semiconductor device 1B in accordance with another embodiment of the present disclosure. FIG. 10 illustrates, in a schematic top-view diagram, an intermediate semiconductor device in accordance with another embodiment of the present disclosure. FIG. 11 illustrates, in a schematic top-view diagram, part of a flow for fabricating the semiconductor device 1B in accordance with another embodiment of the present disclosure. FIGS. 12 and 13 are schematic cross-sectional view diagrams respectively taken along lines A-A' and B-B' in FIG. 8.

With reference to FIGS. 9 to 13, at step S11, a substrate 701 may be provided and a plurality of first bottom branch units 101 may be formed above the substrate 701.

With reference to FIG. 10, a substrate 701 (not shown) and a dielectric layer 601 may have a similar structure as that illustrated in FIGS. 1 and 2, and descriptions thereof are not repeated herein. A plurality first connection vias 105a and a plurality of second connection vias 205a may be formed on the substrate 701 and in the dielectric layer 601. In a top-view perspective, the first connection vias 105a may be diagonally arranged and the second connection vias 205a may be diagonally arranged. The first connection vias 105a and the second connection vias 205a may be alternatively arranged along the first direction DR1 and the second direction DR2.

With reference to FIGS. 11 to 13, a dielectric layer 603 may be formed on the dielectric layer 601 and covering the first connection vias 105a and the second connection vias 205a. A plurality of second connection vias 205b may be respectively correspondingly formed on the second connection vias 205a. A plurality of first bottom branch units 101 may be respectively correspondingly formed on the first connection vias 105a and in the dielectric layer 603. For brevity, clarity, and convenience of description, only one first bottom branch unit 101 is described.

The first bottom branch unit 101 may be formed at a first vertical level and may include a center plate 101c, a first set of bottom plates 101a, and a second set of bottom plates 101b. The center plate 101c may be formed on the first connection via 105a. The center plate 101c may have shape such as circle, oval, triangle, square, rectangle, diamond, parallelogram, polygon, or other suitable shape. In some embodiments, the horizontal cross-sectional area of the center plate 101c may be different from the horizontal cross-sectional area of the first connection via 105a. In some embodiments, the center plate 101c and the first connection via 105a may have a same shape and may have a same horizontal cross-sectional area.

The first set of bottom plates 101a may be formed extending from two sides of the center plate 101c and parallel to the first direction DR1. The second set of bottom plates 101b may be formed extending from other two sides of the center plate 101c and parallel to the second direction DR2. The first set of bottom plates 101a and the second set of bottom plates 101b may be intersected at the center plate 101c.

It should be noted that, in FIGS. 11 to 13, only one center plate 101c is shown in the first bottom branch units 101 for clarity.

Figure 14:
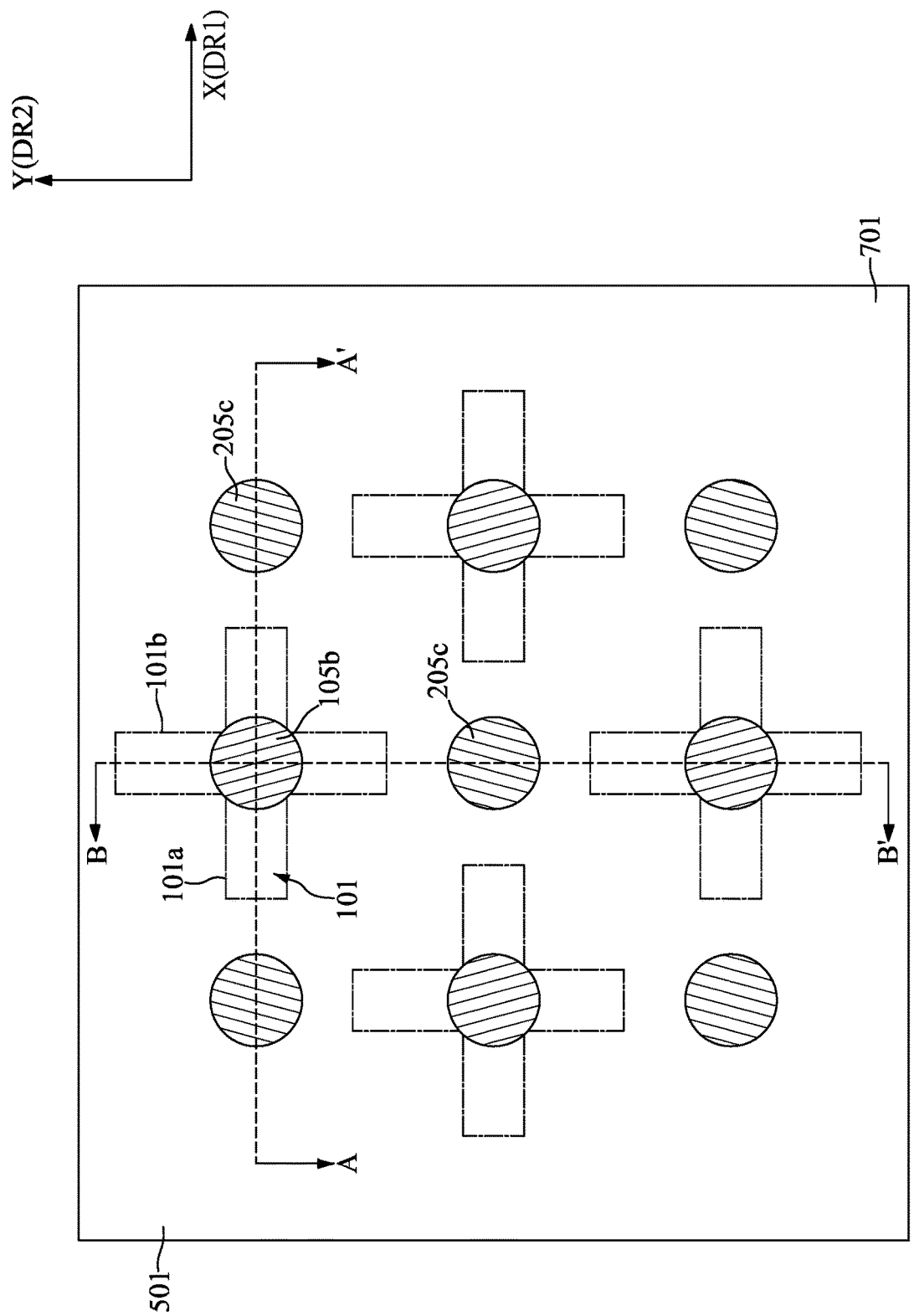
FIG. 14 illustrates, in a schematic top-view diagram, part of the flow for fabricating the semiconductor device in accordance with another embodiment of the present disclosure.
Figure 15:
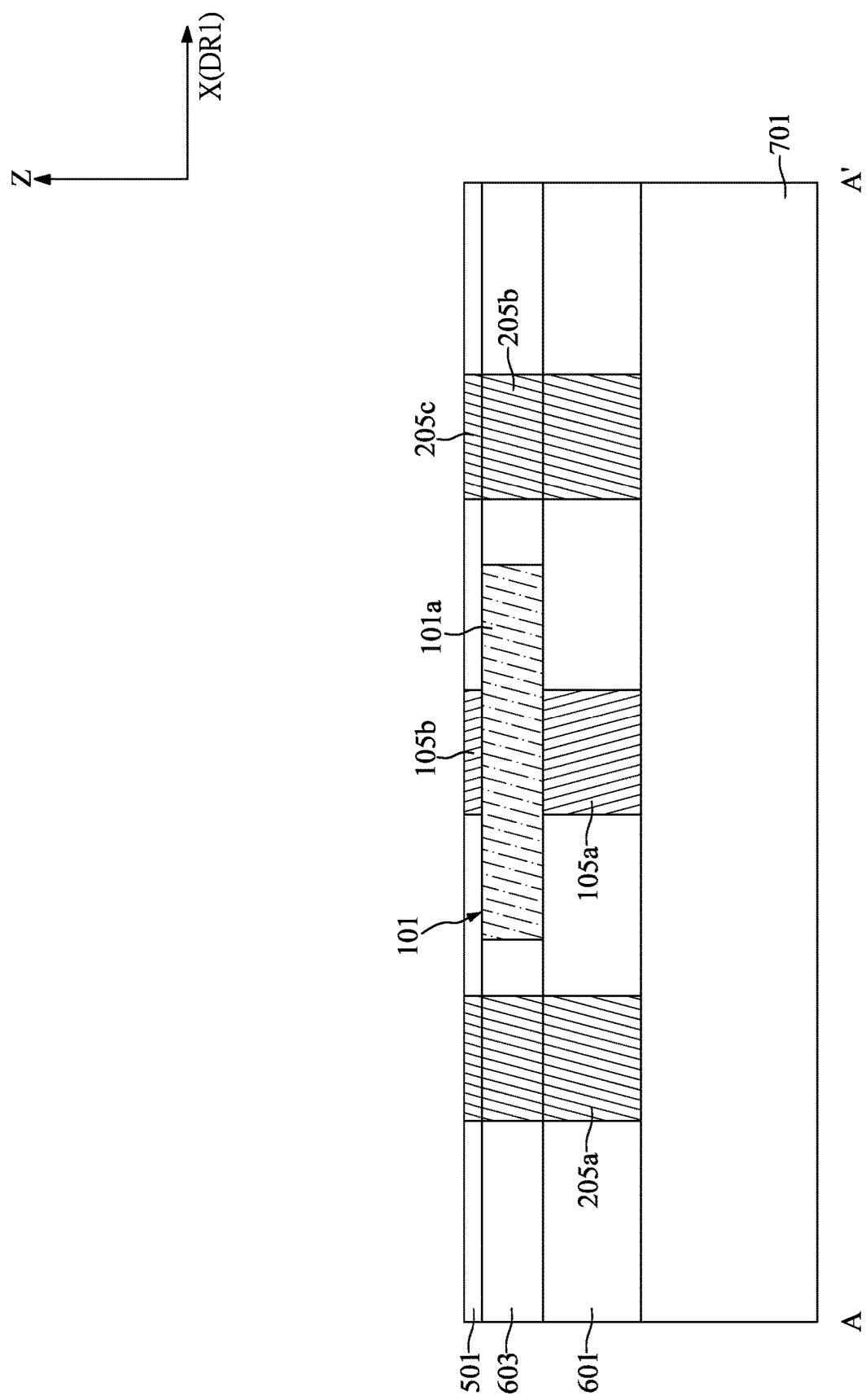
FIGS. 15 and 16 are schematic cross-sectional view diagrams respectively taken along lines A-A' and B-B' in FIG. 14.
Figure 16:
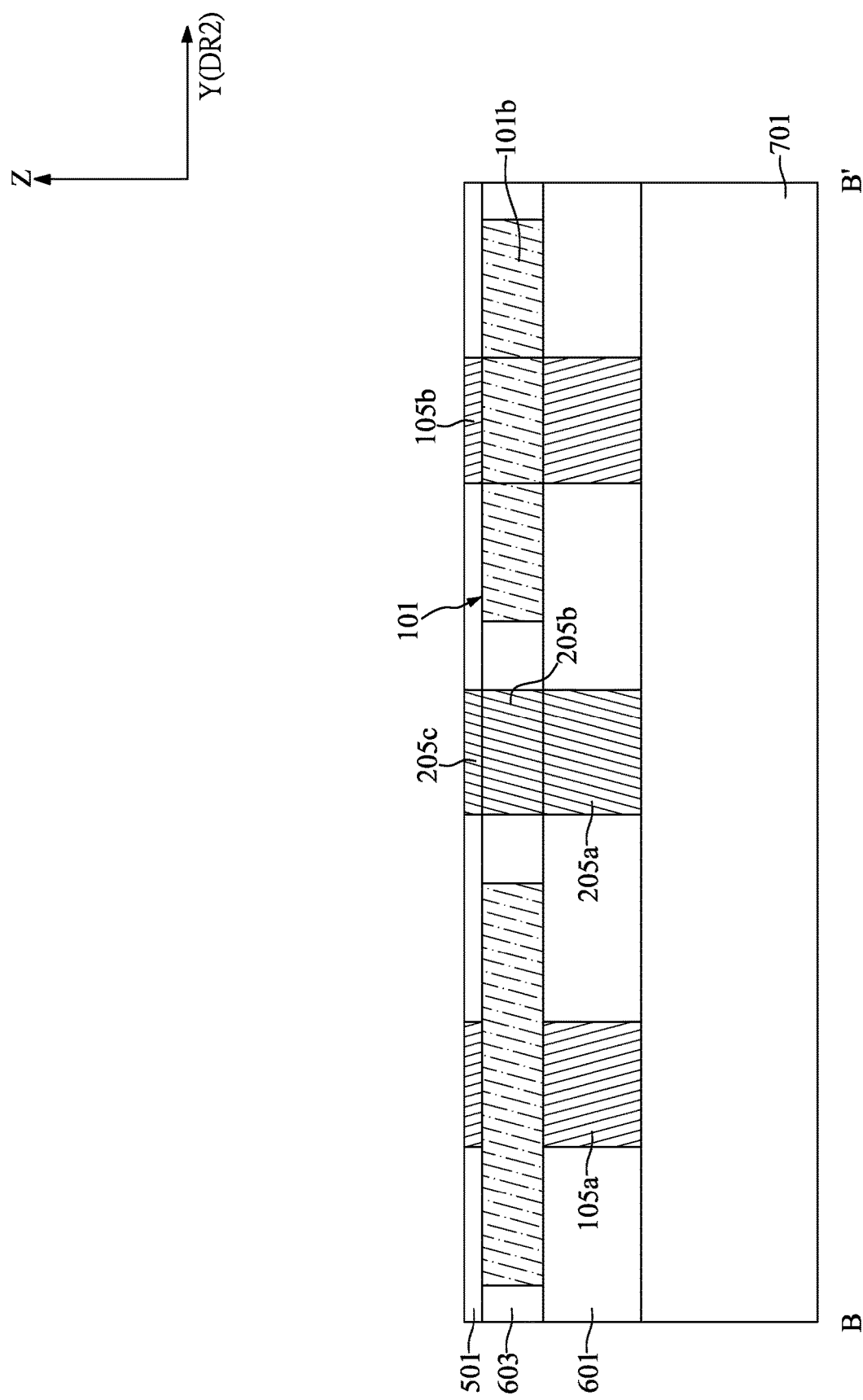
Figure 17:
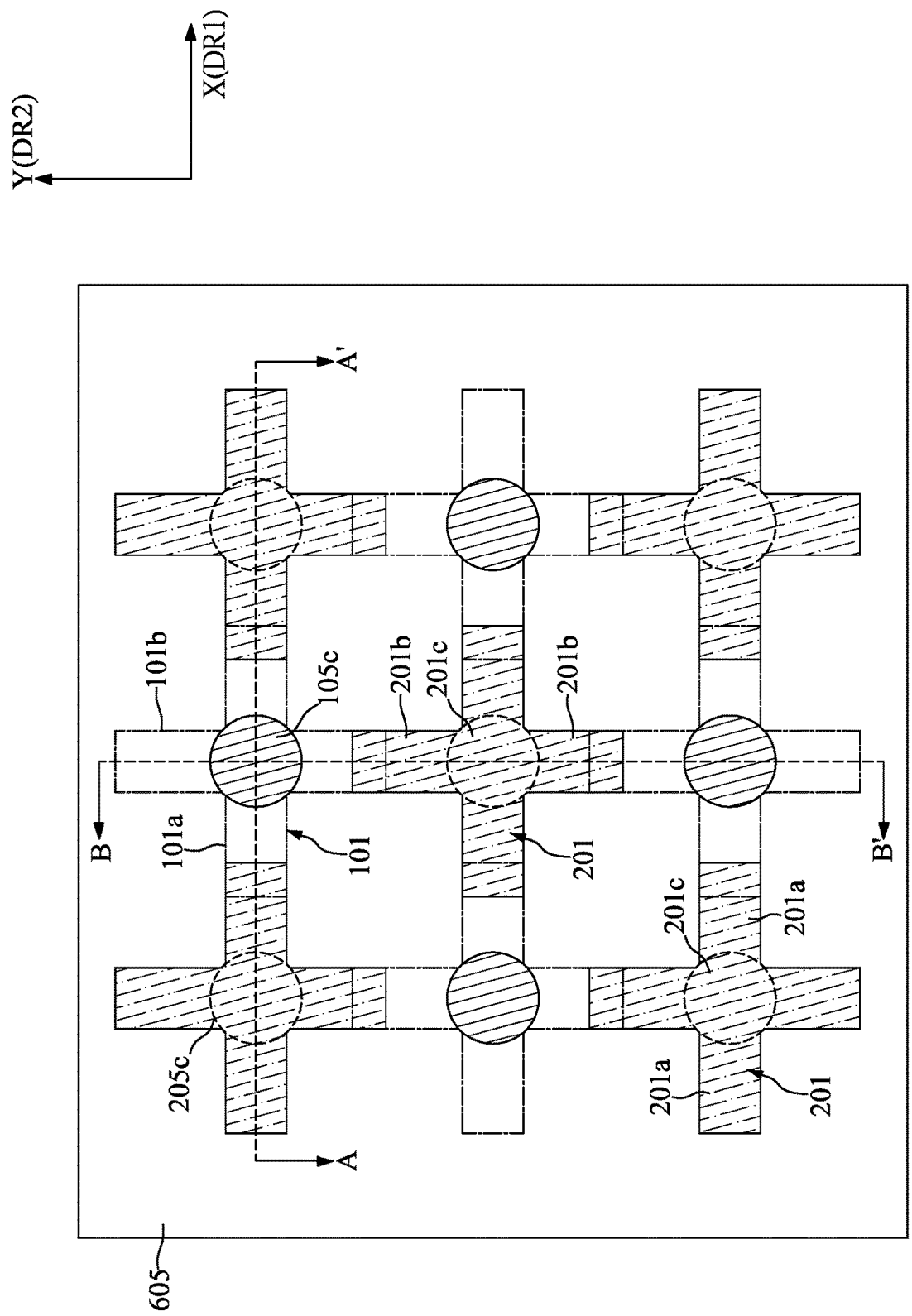
FIG. 17 illustrates, in a schematic top-view diagram, part of the flow for fabricating the semiconductor device 1B in accordance with another embodiment of the present disclosure.
Figure 18:
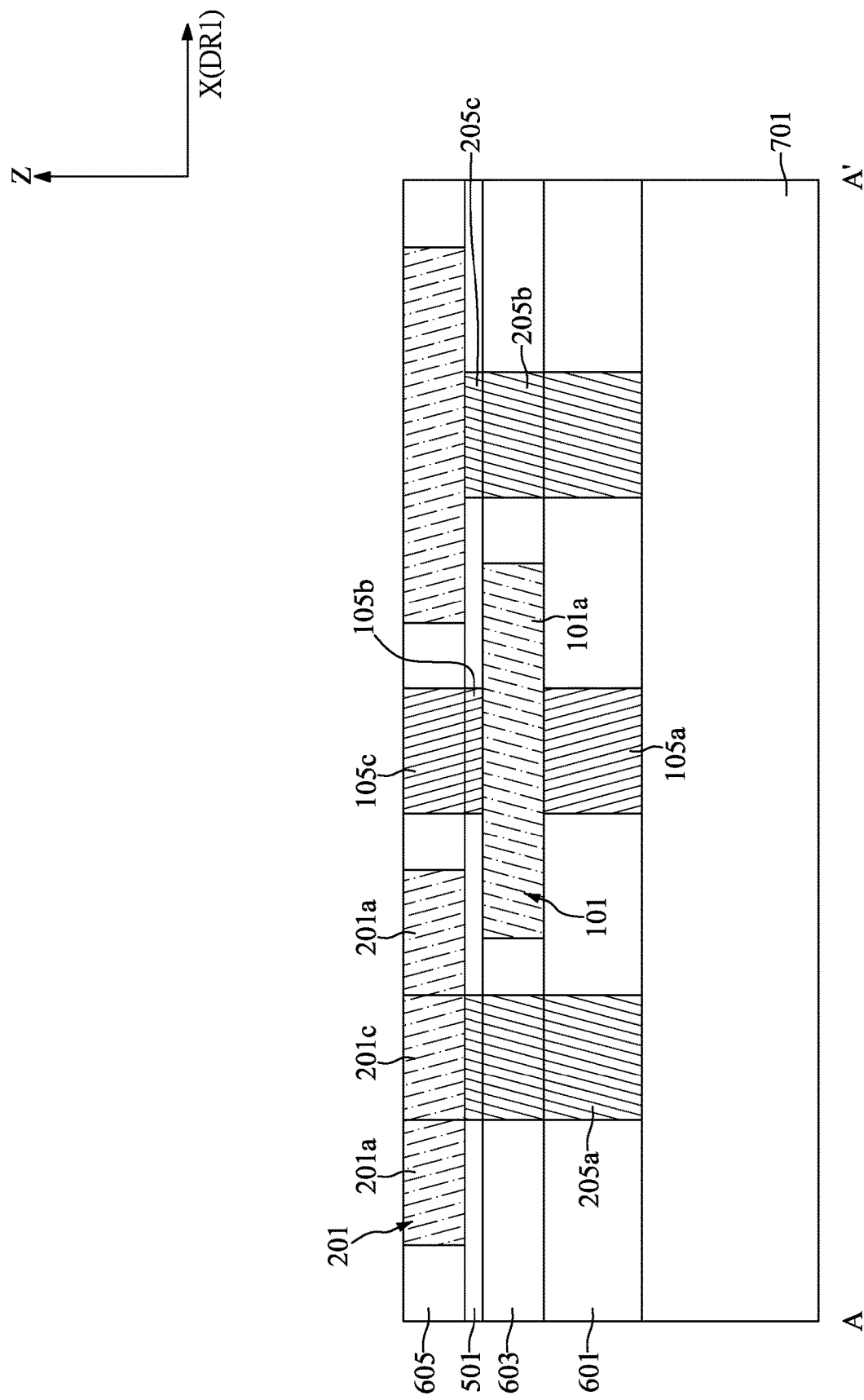
FIGS. 18 and 19 are schematic cross-sectional view diagrams respectively taken along lines A-A' and B-B' in FIG. 17.
Figure 19:
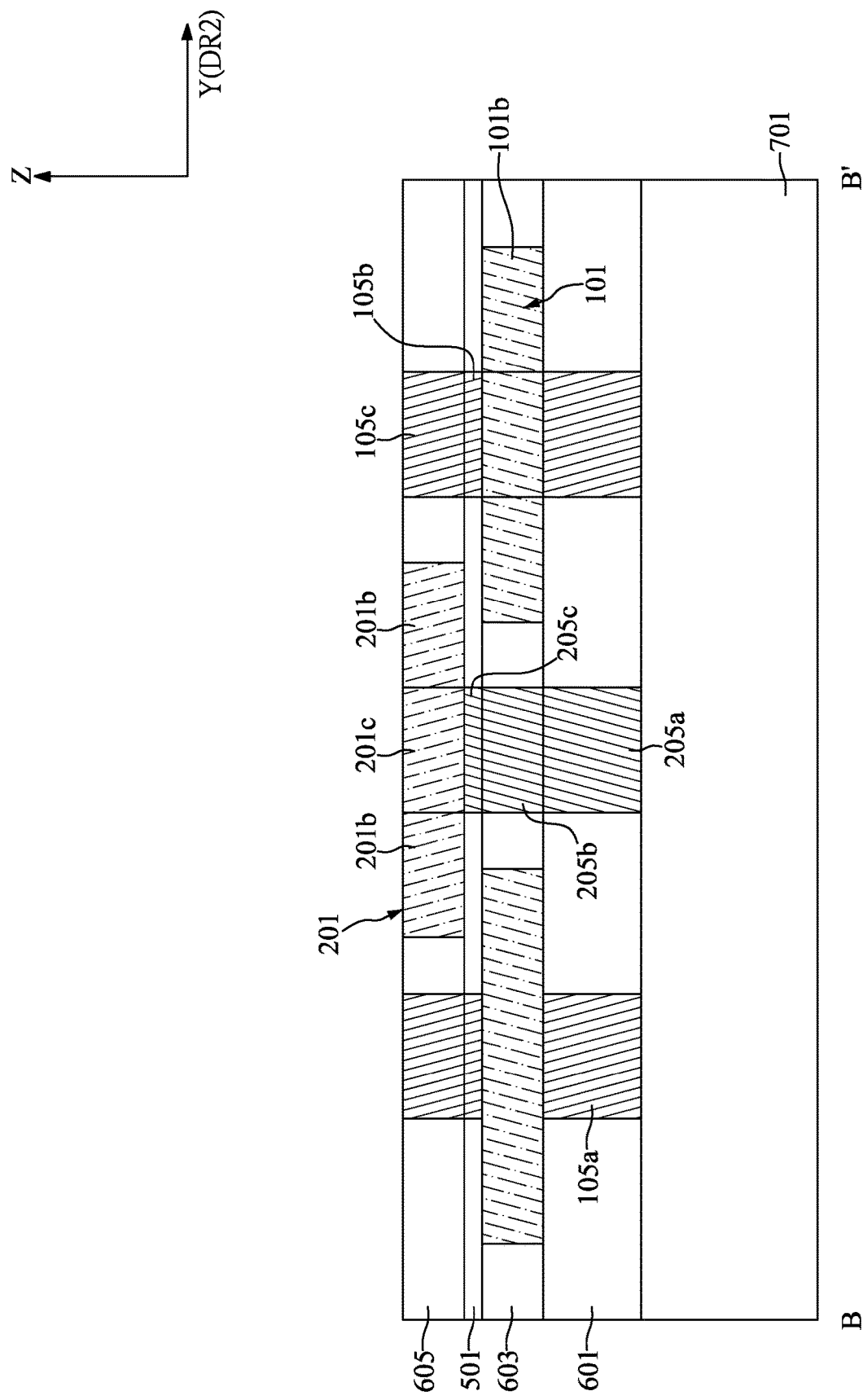

FIG. 14 illustrates, in a schematic top-view diagram, part of the flow for fabricating the semiconductor device 1B in accordance with another embodiment of the present disclosure. FIGS. 15 and 16 are schematic cross-sectional view diagrams respectively taken along lines A-A' and B-B' in FIG. 14. FIG. 17 illustrates, in a schematic top-view diagram, part of the flow for fabricating the semiconductor device 1B in accordance with another embodiment of the present disclosure. FIGS. 18 and 19 are schematic cross-sectional view diagrams respectively taken along lines A-A' and B-B' in FIG. 17.

With reference to FIG. 9 and FIGS. 14 to 19, at step S13, a first insulation layer 501 may be formed to cover the plurality of first bottom branch units 101, and a plurality of second bottom branch units 201 may be formed on the first insulation layer 501 and partially overlapped with the plurality of first bottom branch units 101.

With reference to FIGS. 14 to 16, a first insulation layer 501 may be formed on the dielectric layer 603 to cover the first bottom branch units 101 and the second connection vias 205b. The first insulation layer 501 may have a structure similar to that illustrated in FIGS. 5 and 6, and descriptions thereof are not repeated herein. In some embodiments, the first insulation layer 501 may be an etch stop layer and may be easily integrated into middle-end-of line process or back-end-of-line process.

With reference to FIGS. 14 to 16, a plurality of first connection vias 105b may be respectively correspondingly formed on the center plates 101c of the first bottom branch units 101. The first connection vias 105b may be electrically coupled to the first bottom branch units 101, respectively and correspondingly. A plurality of second connection vias 205c may be respectively correspondingly formed on the second connection vias 205b.

With reference to FIGS. 17 to 19, a dielectric layer 605 may be formed on the dielectric layer 603 to cover the first connection vias 105b and the second connection vias 205c. A plurality of first connection vias 105c may be respectively correspondingly formed on the first connection vias 105b and in the dielectric layer 605. A plurality of second bottom branch units 201 may be respectively correspondingly formed on the second connection vias 205c and in the dielectric layer 605. For brevity, clarity, and convenience of description, only one second bottom branch unit 201 is described.

The second bottom branch unit 201 may be formed at a second vertical level higher than the first vertical level. The second bottom branch unit 201 may include a center plate 201c and a first set of bottom plates 201a. The center plate 201c may be formed on the second connection via 205c. The center plate 201c may have a similar structure as the center plate 101c, and descriptions thereof are not repeated herein.

The first set of bottom plates 201a may be formed extending from two sides of the center plate 201c and parallel to the direction of the first set of bottom plates 101a of the first bottom branch unit 101. In other words, the first set of bottom plates 201a may be extending along the first direction DR1. The second set of bottom plates 201b may be formed extending from other two sides of the center plate 201c and parallel to the direction of the second set of bottom plates 101b of the first bottom branch unit 101. In other words, the second set of bottom plates 201b may be extending along the second direction DR2. The first set of bottom plates 201a and the second set of bottom plates 201b may be intersected at the center plate 201c.

With reference to FIGS. 17 to 19, the first set of bottom plates 201a of the second bottom branch unit 201 and the first set of bottom plates 101a of the first bottom branch unit 101 may be partially overlapped in a top-view perspective. The first insulation layer 501 is disposed between the first set of bottom plates 101a and the first set of bottom plates 201a in a cross-sectional perspective. The first insulation layer 501 and the overlapped first set of bottom plates 101a of the first bottom branch unit 101 and first set of bottom plates 201a of the second bottom branch unit 201 together configure a programmable structure.

With reference to FIGS. 17 to 19, the second set of bottom plates 201b of the second bottom branch unit 201 and the second set of bottom plates 101b of the first bottom branch unit 101 may be partially overlapped in a top-view perspective. The first insulation layer 501 is disposed between the second set of bottom plates 101b and the second set of bottom plates 201b in a cross-sectional perspective. The first insulation layer 501 and the overlapped second set of bottom plates 101b of the first bottom branch unit 101 and second set of bottom plates 201b of the second bottom branch unit 201 together configure another programmable structure.

Figure 20:
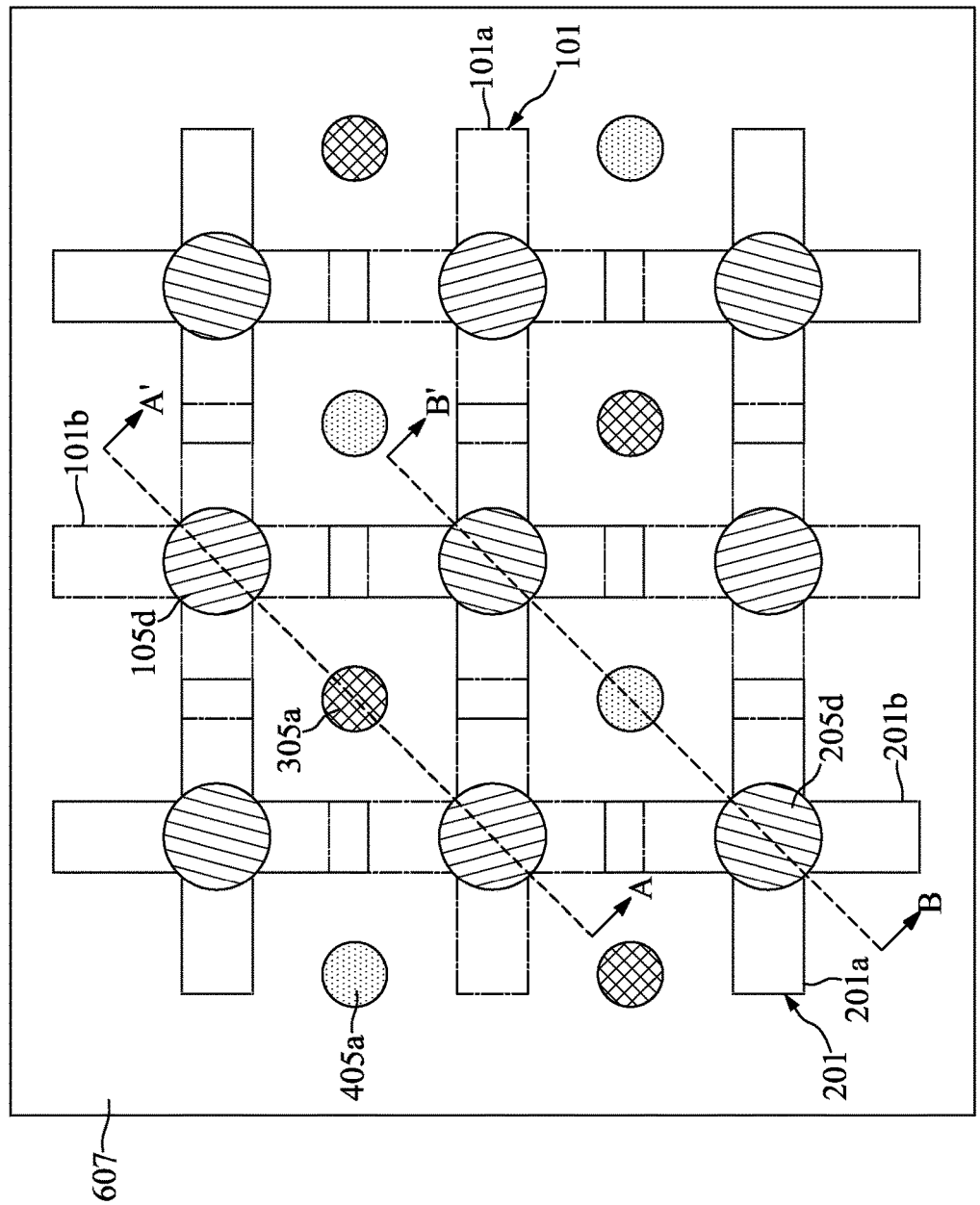
FIG. 20 illustrates, in a schematic top-view diagram, part of the flow for fabricating the semiconductor device in accordance with another embodiment of the present disclosure.
Figure 21:
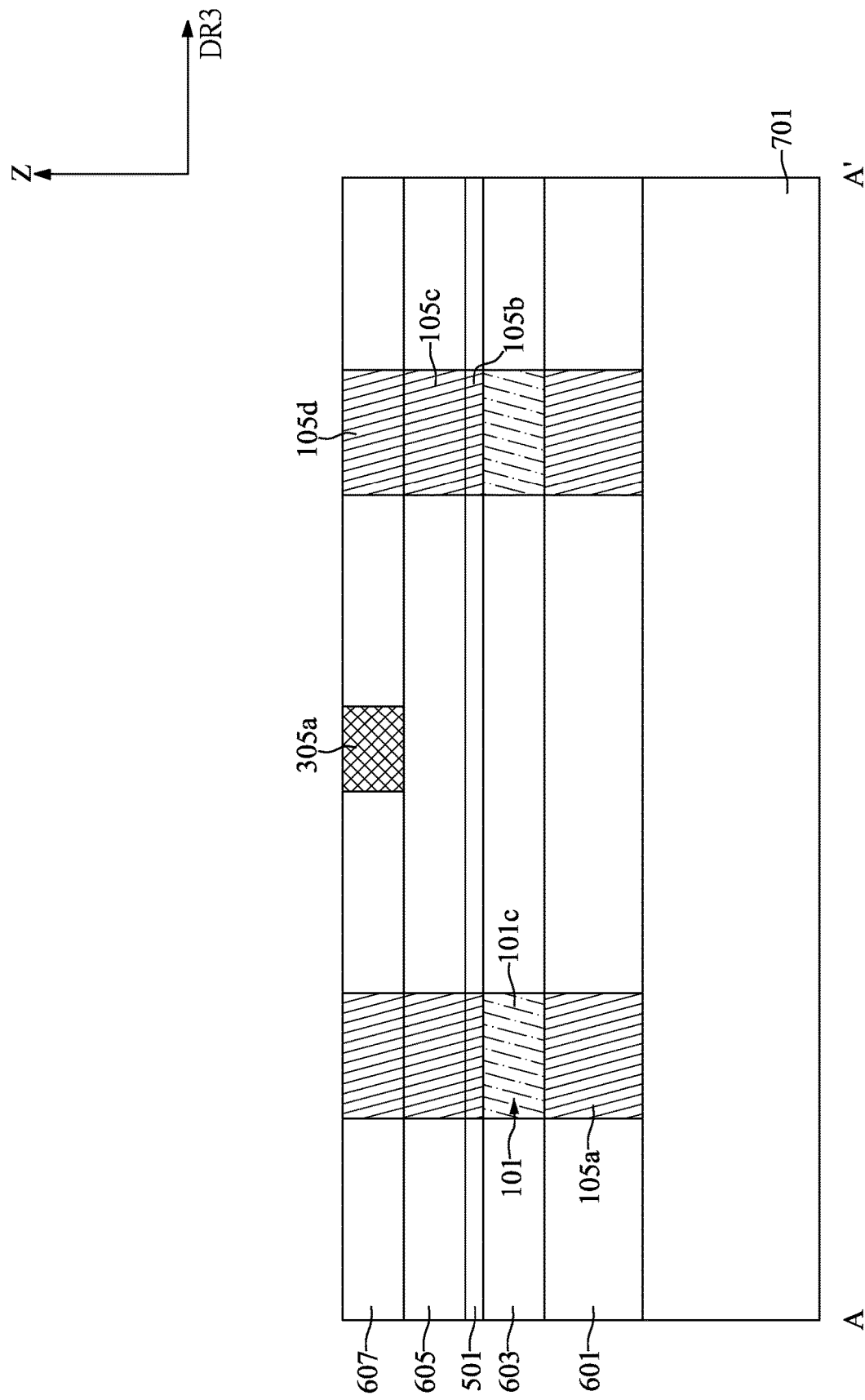
FIGS. 21 and 22 are schematic cross-sectional view diagrams respectively taken along lines A-A' and B-B' in FIG. 20.
Figure 22:
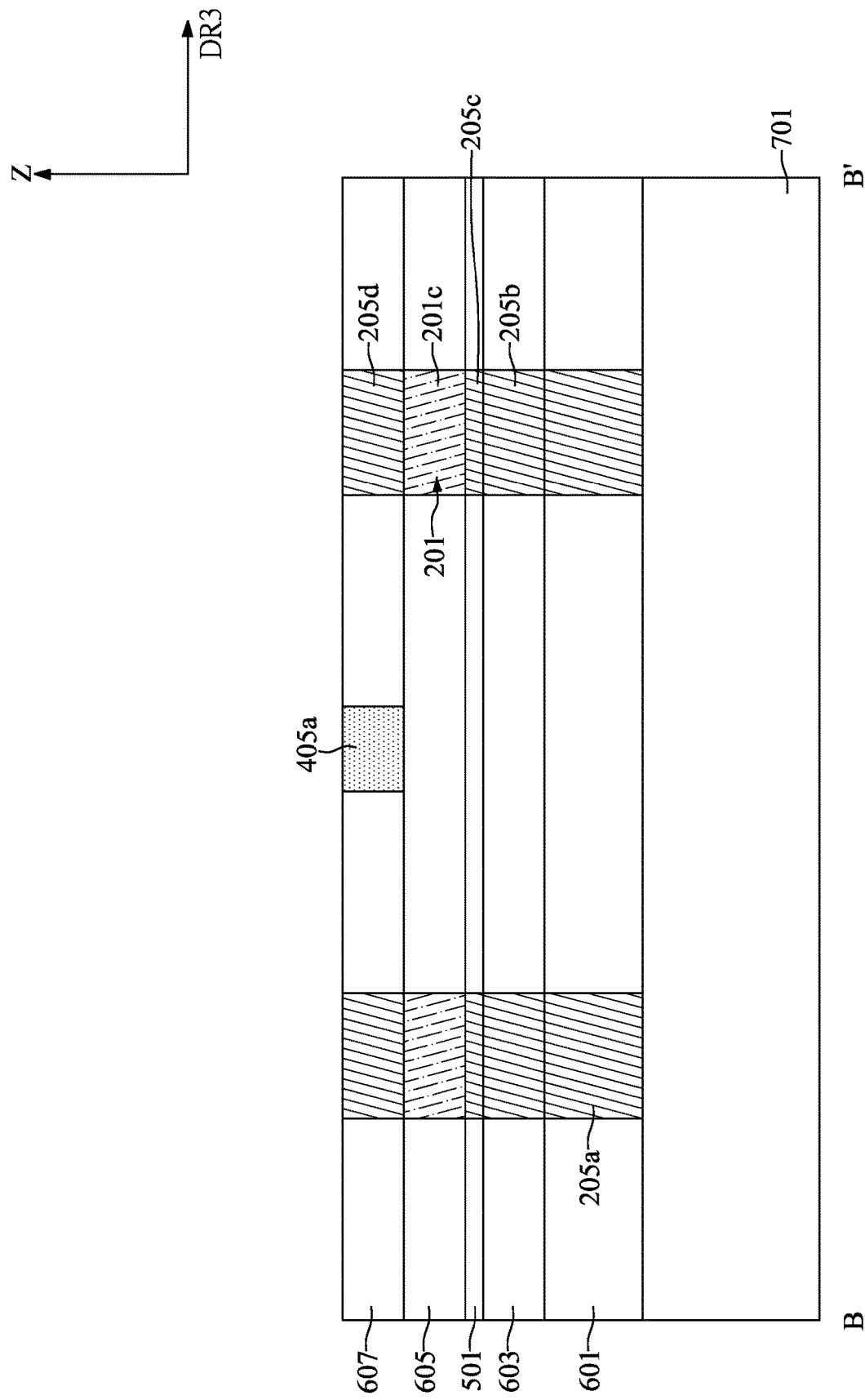
Figure 23:
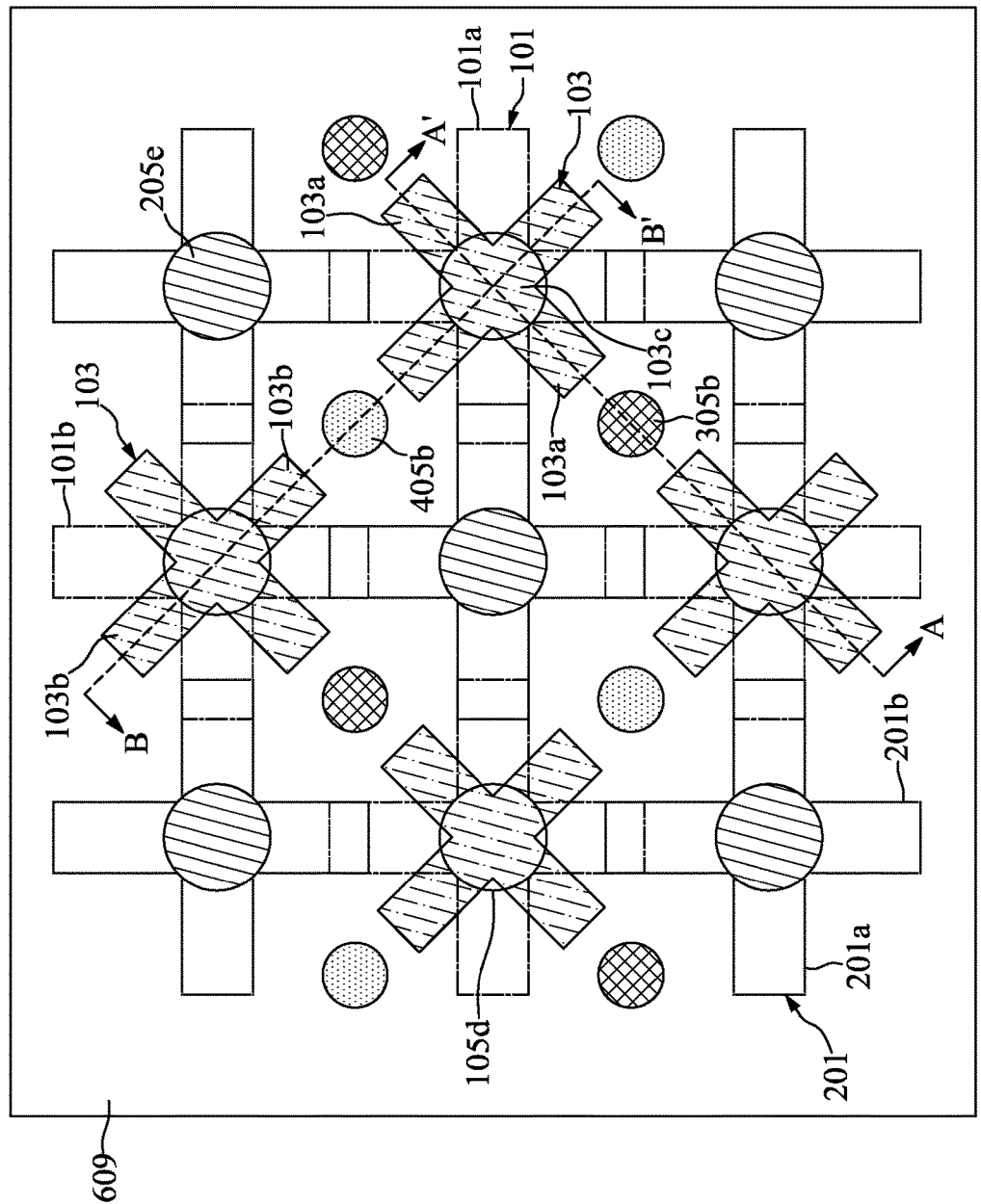
FIG. 23 illustrates, in a schematic top-view diagram, part of the flow for fabricating the semiconductor device in accordance with another embodiment of the present disclosure.
Figure 24:
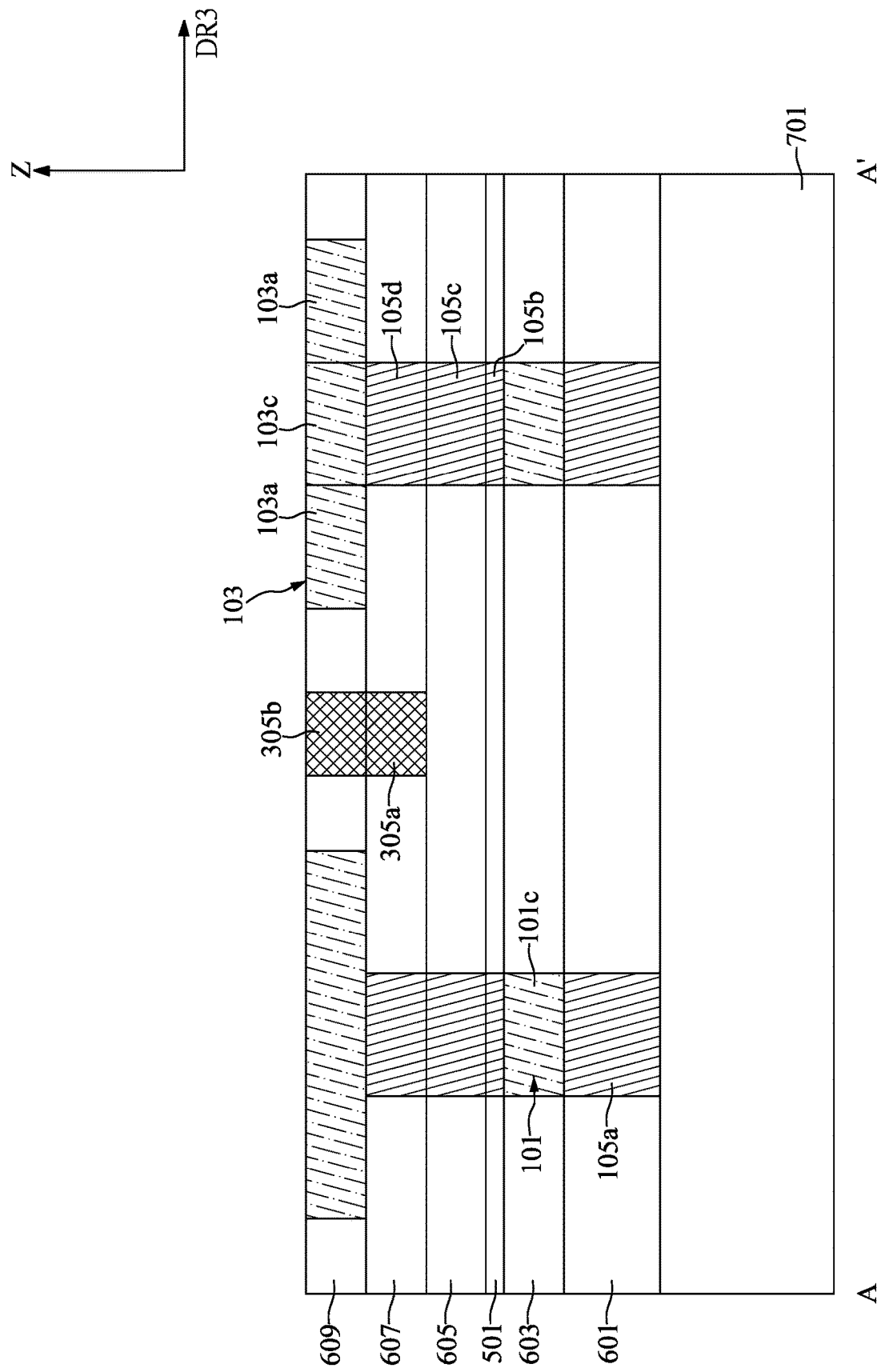
FIGS. 24 and 25 are schematic cross-sectional view diagrams respectively taken along lines A-A' and B-B' in FIG. 23.
Figure 25:
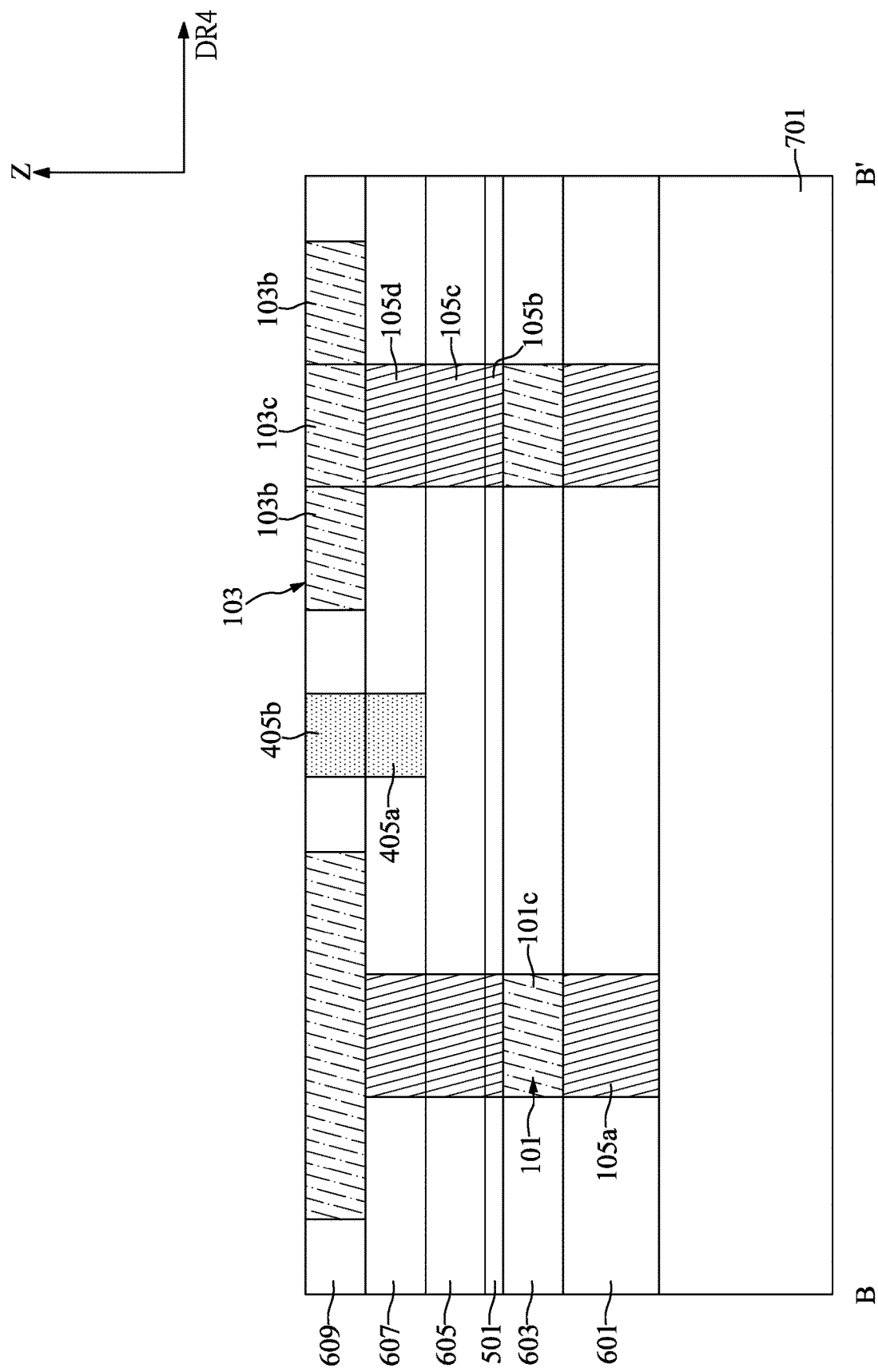

FIG. 20 illustrates, in a schematic top-view diagram, part of the flow for fabricating the semiconductor device 1B in accordance with another embodiment of the present disclosure. FIGS. 21 and 22 are schematic cross-sectional view diagrams respectively taken along lines A-A' and B-B' in FIG. 20. FIG. 23 illustrates, in a schematic top-view diagram, part of the flow for fabricating the semiconductor device 1B in accordance with another embodiment of the present disclosure. FIGS. 24 and 25 are schematic cross-sectional view diagrams respectively taken along lines A-A' and B-B' in FIG. 23.

With reference to FIG. 9 and FIGS. 20 to 25, at step S15, a plurality of first top branch units 103 may be formed above the plurality of first bottom branch units 101 and may be electrically coupled to the plurality of first bottom branch units 101.

With reference to FIGS. 20 to 22, a dielectric layer 607 may be formed on the dielectric layer 605 and covering the first connection vias 105c and the second bottom branch units 201. A plurality of first connection vias 105d may be respectively correspondingly formed on the first connection vias 105c and in the dielectric layer 607. A plurality of second connection vias 205d may be respectively correspondingly formed on the center plates 201c and in the dielectric layer 607.

With reference to FIGS. 20 to 22, a plurality of third connection vias 305a and a plurality of fourth connection vias 405a may be formed in the dielectric layer 607. In a top-view perspective, the third connection vias 305a may be diagonally arranged. The third connection vias 305a may be also diagonally arranged with the first connection vias 105d and the second connection vias 205d, respectively. The fourth connection vias 405a may be diagonally arranged. The fourth connection vias 405a may be also diagonally arranged with the first connection vias 105d and the second connection vias 205d, respectively. The third connection vias 305a and the fourth connection vias 405a may be alternatively arranged along the first direction DR1 and the second direction DR2. In some embodiments, the horizontal cross-sectional area of third connection vias 305a or the fourth connection vias 405a may be less than the horizontal cross-sectional area of the first connection vias 105d or the second connection vias 205d.

In some embodiments, the third connection vias 305a and the fourth connection vias 405a may be formed accompanying with the first connection vias 105a, 105b, 105c, 105d and the second connection vias 205a, 205b, 205c, 205d. In that situation, the bottom surfaces of the third connection vias 305a and the fourth connection vias 405a may contact the substrate 701. Concurrently forming the third connection vias 305a, the fourth connection vias 405a, the first connection vias 105a, 105b, 105c, 105d, and the second connection vias 205a, 205b, 205c, 205d may reduce the number of masks used for fabrication of the semiconductor device 1B. Therefore, the cost for fabrication of the semiconductor device 1B may be reduced.

With reference to FIGS. 23 to 25, a dielectric layer 609 may be formed on the dielectric layer 607 and covering the first connection vias 105d, the second connection vias 205d, the third connection vias 305a, and the fourth connection vias 405a. A plurality of second connection vias 205e may be respectively correspondingly formed on the second connection vias 205d (not shown) and in the dielectric layer 609. A plurality of third connection vias 305b may be respectively correspondingly formed on the third connection vias 305a and in the dielectric layer 609. A plurality of fourth connection vias 405b may be respectively correspondingly formed on the fourth connection vias 405a and in the dielectric layer 609.

With reference to FIGS. 23 to 25, the plurality of first top branch units 103 may be respectively correspondingly formed on the first connection vias 105d and in the dielectric layer 609. In some embodiments, no additional dielectric layer (e.g., the dielectric layer 607) is presence between the first top branch units 103 and the second bottom branch units 201. For brevity, clarity, and convenience of description, only one first top branch unit 103 is described.

The first top branch unit 103 may be formed at a third vertical level higher than the second vertical level. The first top branch unit 103 may include a center plate 103c, a first set of top plates 103a, and a second set of top plates 103b. The center plate 103c may be formed on the first connection via 105d. The center plate 103c may have a structure similar to the center plate 101c, and descriptions thereof are not repeated herein.

The first set of top plates 103a may be formed extending from two sides of the center plate 103c and parallel to a third direction DR3. The third direction DR3 is slanted with respect to the first direction DR1 and the second direction DR2. The second set of top plates 103b may be formed extending from other two sides of the center plate 103c and parallel to a fourth direction DR4. The fourth direction DR4 is perpendicular to the third direction DR3. The first set of top plates 103a and the second set of top plates 103b may be intersected at the center plate 103c.

Figure 26:
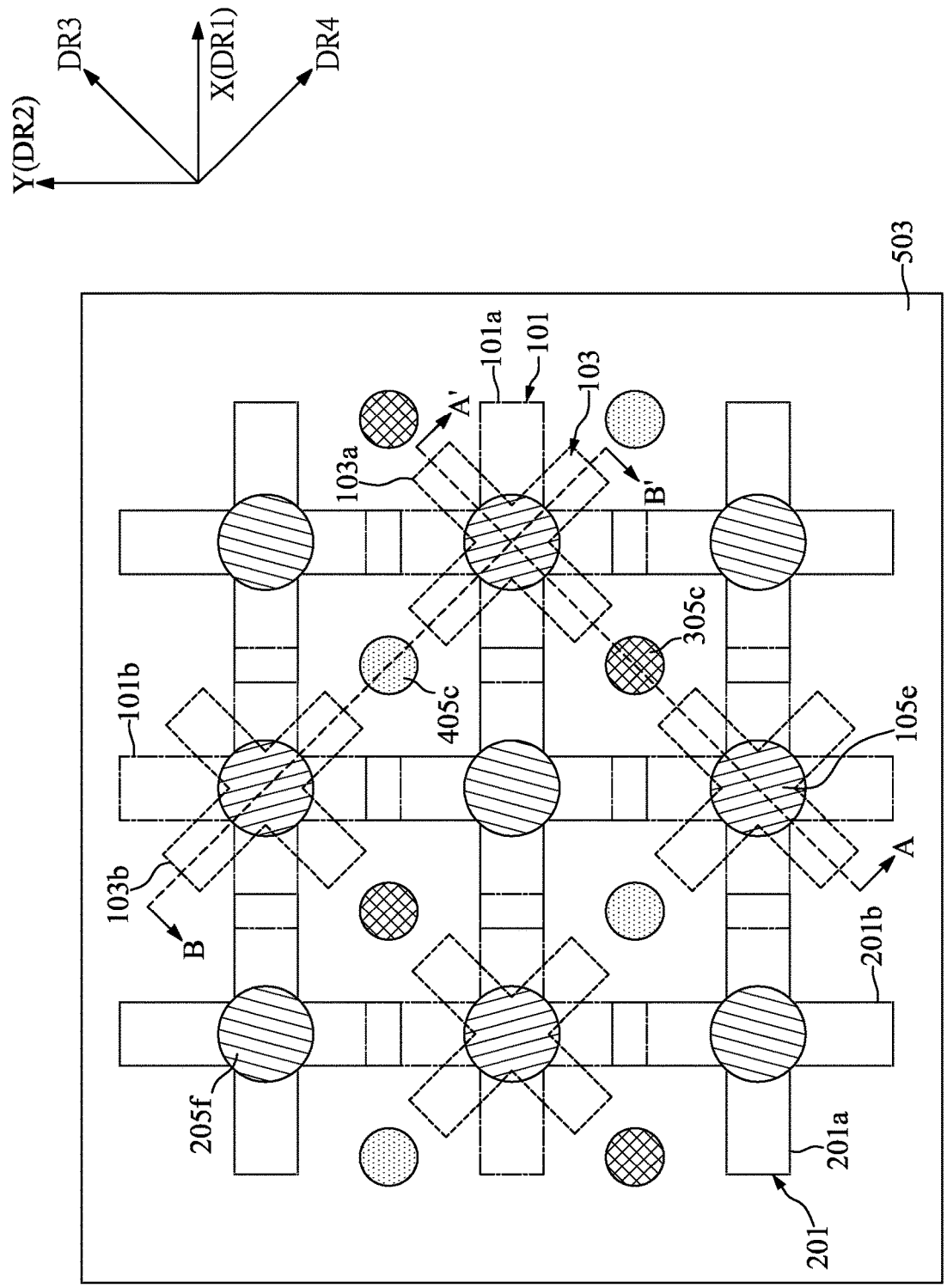
FIG. 26 illustrates, in a schematic top-view diagram, part of the flow for fabricating the semiconductor device in accordance with another embodiment of the present disclosure.
Figure 27:
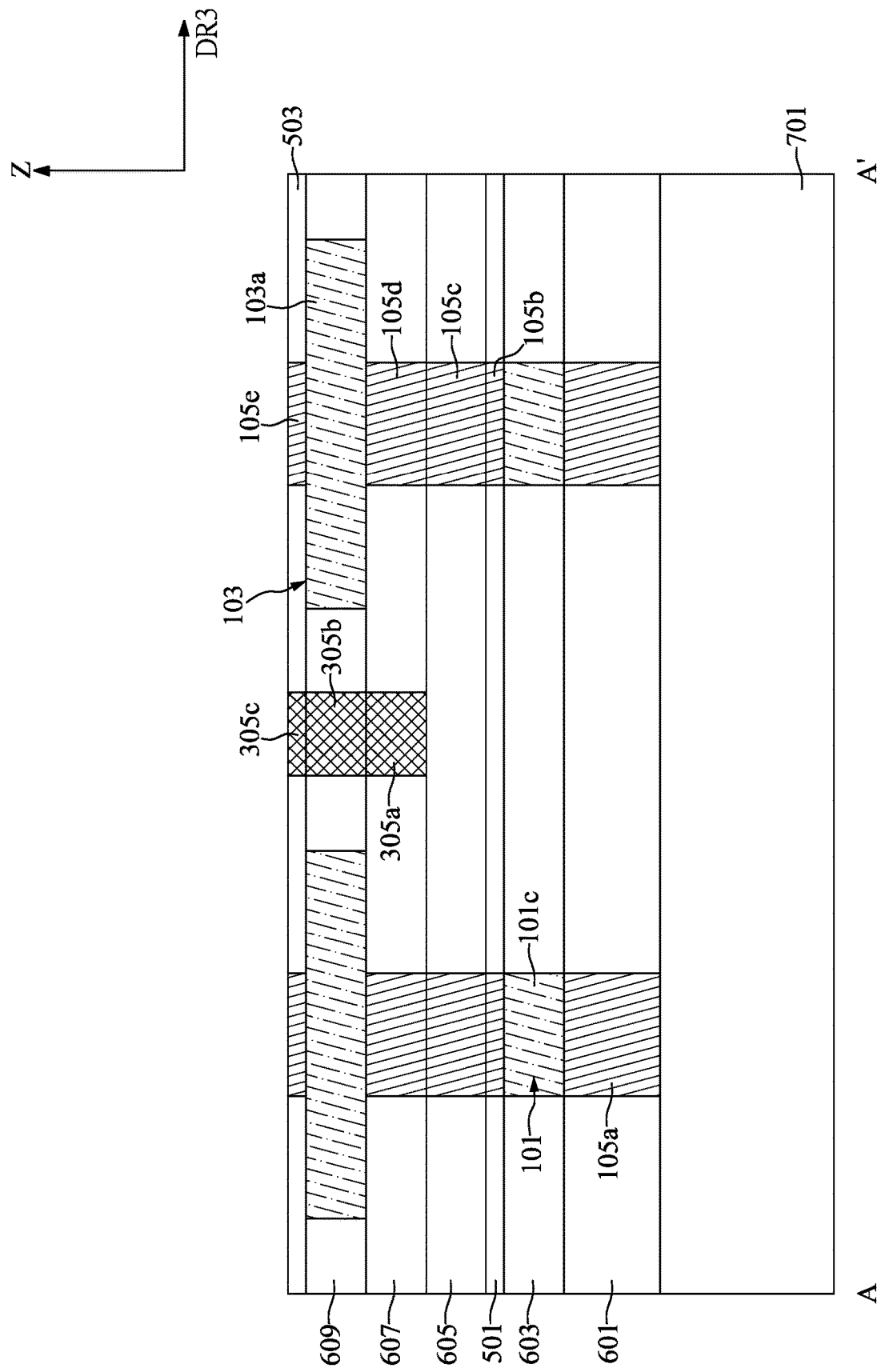
FIGS. 27 and 28 are schematic cross-sectional view diagrams respectively taken along lines A-A' and B-B' in FIG. 26.
Figure 28:
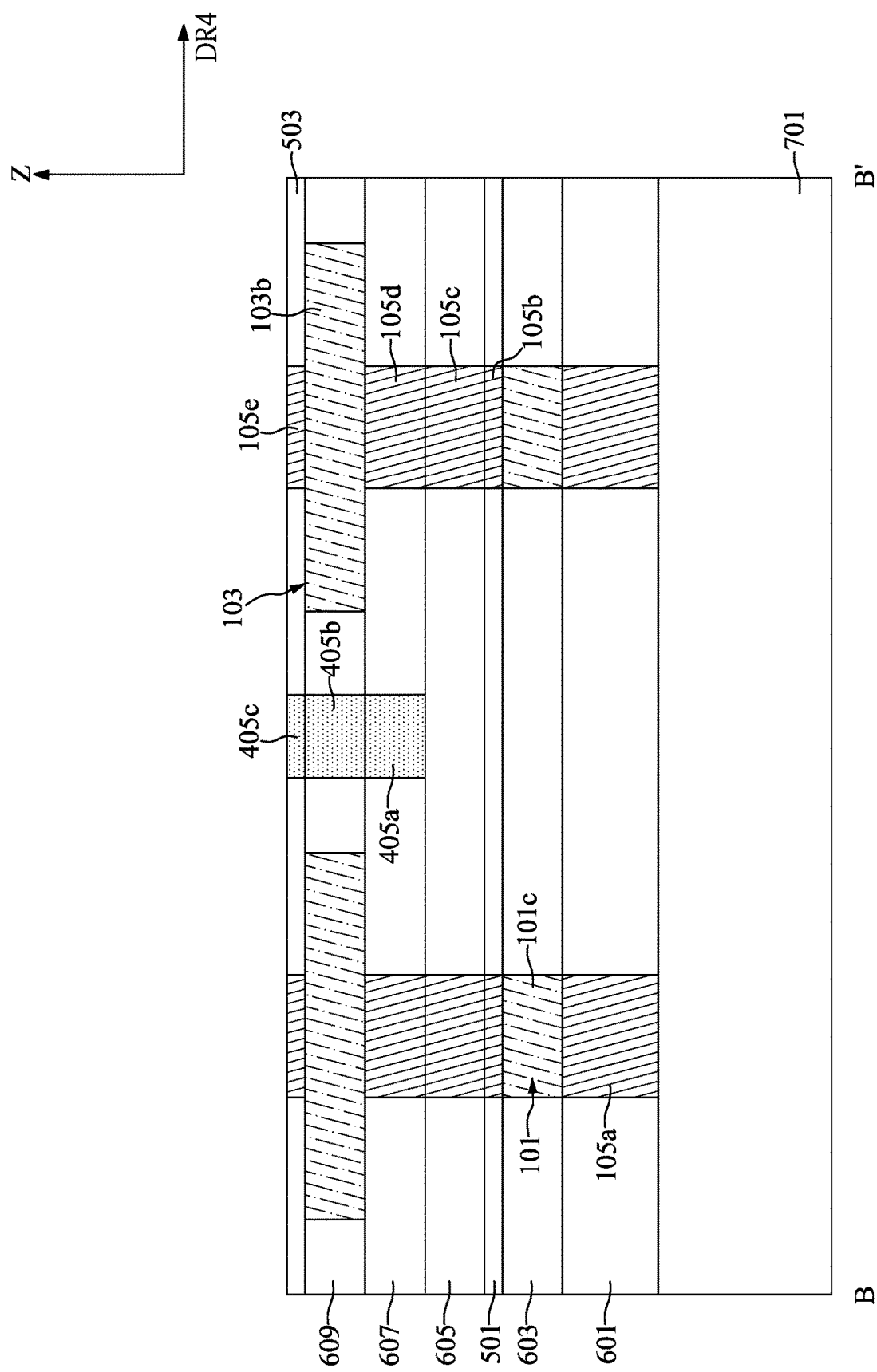
Figure 29:
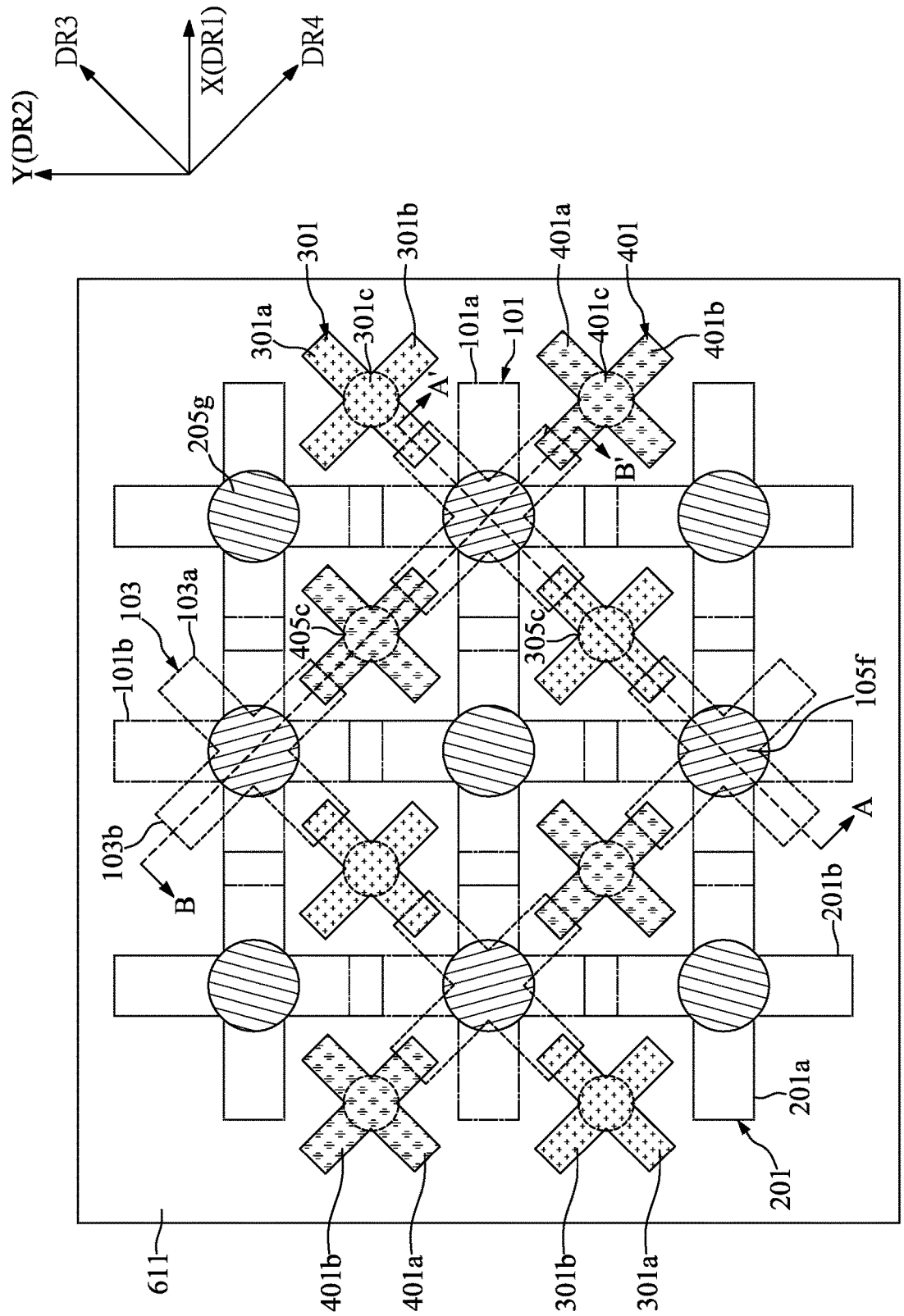
FIG. 29 illustrates, in a schematic top-view diagram, part of the flow for fabricating the semiconductor device in accordance with another embodiment of the present disclosure.
Figure 30:
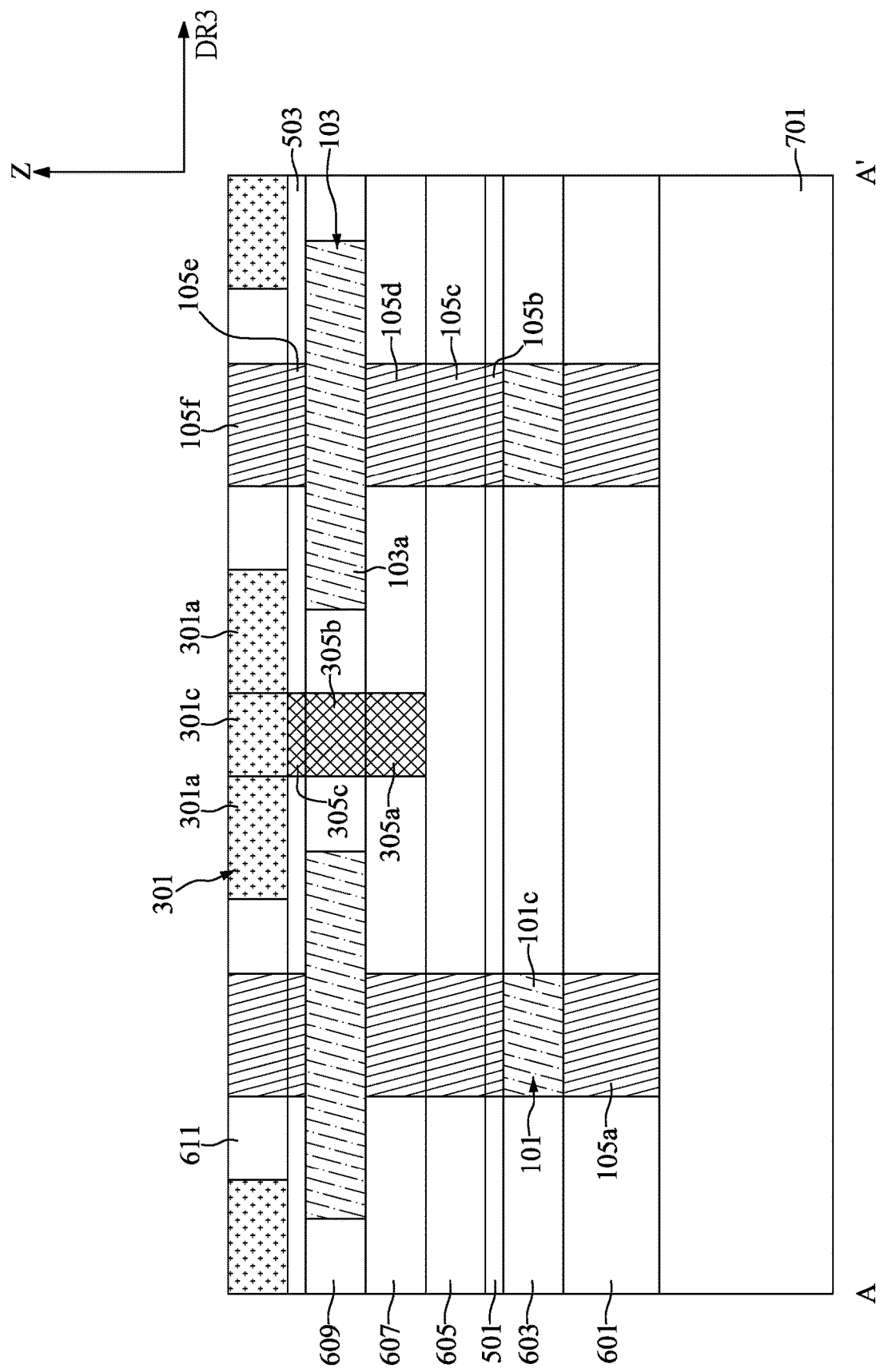
FIGS. 30 and 31 are schematic cross-sectional view diagrams respectively taken along lines A-A' and B-B' in FIG. 29.
Figure 31:
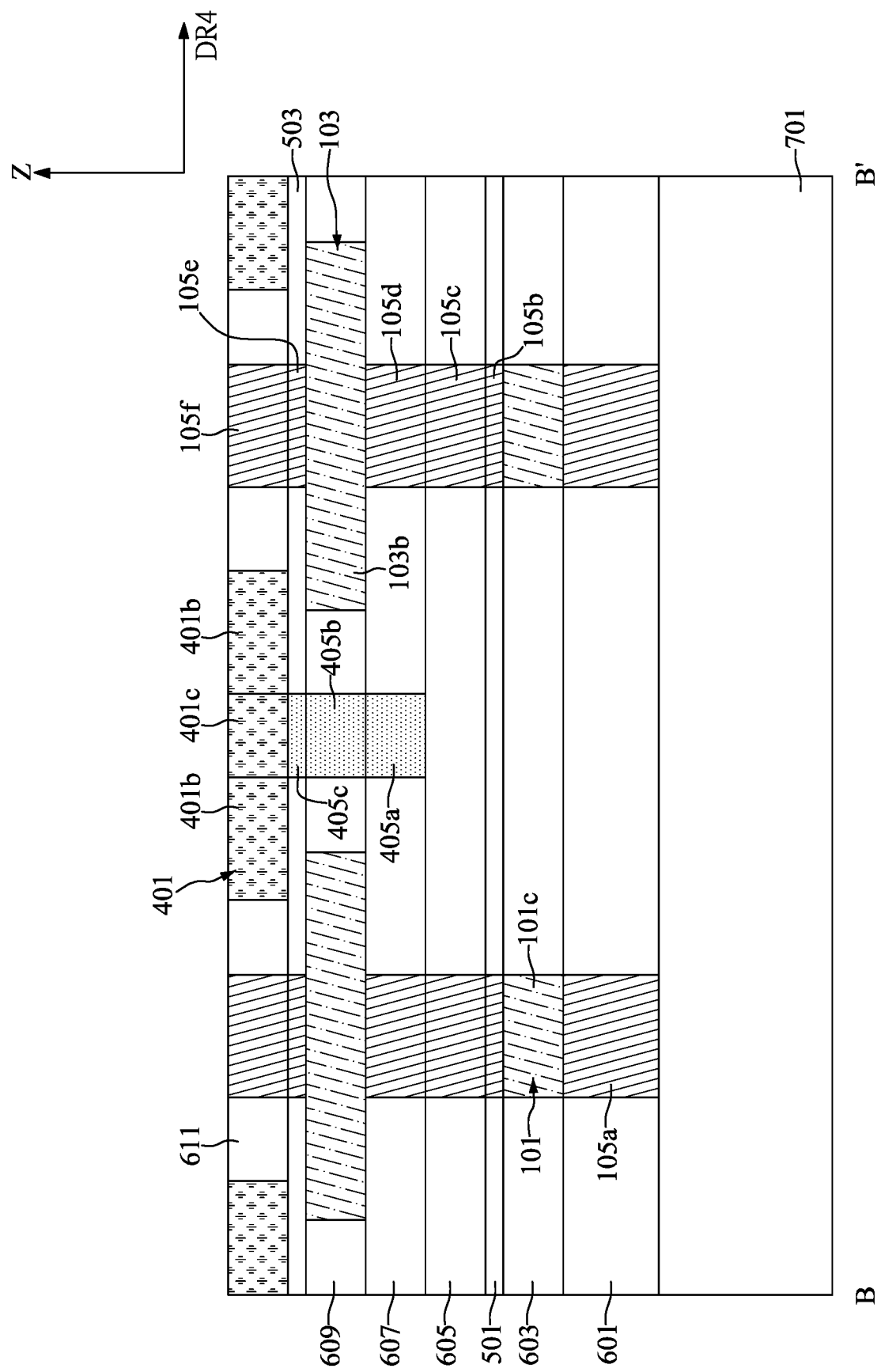

FIG. 26 illustrates, in a schematic top-view diagram, part of the flow for fabricating the semiconductor device 1B in accordance with another embodiment of the present disclosure. FIGS. 27 and 28 are schematic cross-sectional view diagrams respectively taken along lines A-A' and B-B' in FIG. 26. FIG. 29 illustrates, in a schematic top-view diagram, part of the flow for fabricating the semiconductor device 1B in accordance with another embodiment of the present disclosure. FIGS. 30 and 31 are schematic cross-sectional view diagrams respectively taken along lines A-A' and B-B' in FIG. 29.

With reference to FIG. 9 and FIGS. 26 to 31, at step S17, a second insulation layer 503 may be formed to cover the plurality of first top branch units 103, a plurality of first middle branch units 301 may be formed on the second insulation layer 503 and partially overlapped with the plurality of first top branch units 103, and a plurality of second middle branch unit 401 may be formed on the second insulation layer 503 and partially overlapped with the plurality of first top branch units 103.

With reference to FIGS. 26 to 28, a second insulation layer 503 may be formed on the dielectric layer 609 to cover the first top branch unit 103, the second connection vias 205e, the third connection vias 305b, and the fourth connection vias 405b. The second insulation layer 503 may have a structure similar to the first insulation layer 501, and descriptions thereof are not repeated herein. In some embodiments, the second insulation layer 503 may be an etch stop layer and may be easily integrated into middle-end-of line process or back-end-of-line process.

With reference to FIGS. 26 to 28, a plurality of first connection vias 105e may be respectively correspondingly formed on the center plates 103c of the first bottom branch units 101. A plurality of second connection vias 205f may be respectively correspondingly formed on the second connection vias 205e. A plurality of third connection vias 305c may be respectively correspondingly formed on the third connection vias 305b. A plurality of fourth connection vias 405c may be respectively correspondingly formed on the fourth connection vias 405b.

With reference to FIGS. 29 to 31, a dielectric layer 611 may be formed on the dielectric layer 609 to cover the first connection vias 105e, the second connection vias 205f, the third connection vias 305c, and the fourth connection vias 405c. A first connection vias 105f may be respectively correspondingly formed on the first connection vias 105e and in the dielectric layer 611. A plurality of second connection vias 205g may be respectively correspondingly formed on the second connection vias 205f and in the dielectric layer 611. The plurality of first middle branch units 301 may be respectively correspondingly formed on the third connection vias 305c and in the dielectric layer 611. For brevity, clarity, and convenience of description, only one first middle branch unit 301 is described. The plurality of second middle branch units 401 may be respectively correspondingly formed on the fourth connection vias 405c and in the dielectric layer 611. For brevity, clarity, and convenience of description, only one second middle branch unit 401 is described.

The first middle branch unit 301 may be formed at a fourth vertical level higher than the third vertical level. The first middle branch unit 301 may include a center plate 301c, a first set of middle plates 301a, and a second set of middle plates 301b. The center plate 301c may be formed on the third connection via 305c. The center plate 301c may have a structure similar to the center plate 101c, and descriptions thereof are not repeated herein.

The first set of middle plates 301a may be formed extending from two sides of the center plate 301c and parallel to the direction of the first set of top plates 103a of the first top branch unit 103. In other words, the first set of middle plates 301a may be extending along the third direction DR3. The second set of middle plates 301b may be formed extending from other two sides of the center plate 301c and parallel to the direction fourth direction DR4. The first set of middle plates 301a and the second set of middle plates 301b may be intersected at the center plate 301c.

With reference to FIGS. 29 to 31, the first set of middle plates 301a of the first middle branch unit 301 and the first set of top plates 103a of the first top branch unit 103 may be partially overlapped in a top-view perspective. The second insulation layer 503 is disposed between the first set of top plates 103a and the first set of middle plates 301a in a cross-sectional perspective. The second insulation layer 503 and the overlapped first set of top plates 103a of the first top branch unit 103 and first set of middle plates 301a of the first middle branch unit 301 together configure another programmable structure.

With reference to FIGS. 29 to 31, the second middle branch unit 401 may be formed at the same vertical level as the first middle branch unit 301 (i.e., the fourth vertical level). The second middle branch unit 401 may include a center plate 401c, a first set of middle plates 401a, and a second set of middle plates 401b. The center plate 401c may be formed on the fourth connection via 405c. The center plate 401c may have a structure similar to the center plate 101c, and descriptions thereof are not repeated herein.

The first set of middle plates 401a may be formed extending from two sides of the center plate 401c and parallel to the third direction DR3. The second set of middle plates 401b may be formed extending from other two sides of the center plate 401c and parallel to direction of the second set of top plates 103b of the first top branch unit 103. In other words, the second set of middle plates 401b may be extending along the fourth direction DR4. The first set of middle plates 401a and the second set of middle plates 401b may be intersected at the center plate 401c.

The second set of middle plates 401b of the second middle branch unit 401 and the second set of top plates 103b of the first top branch unit 103 may be partially overlapped in a top-view perspective. The second insulation layer 503 is disposed between the second set of top plates 103b and the second set of middle plates 401b in a cross-sectional perspective. The second insulation layer 503 and the overlapped second set of top plates 103b of the first top branch unit 103 and second set of middle plates 401b of the second middle branch unit 401 together configure another programmable structure.

Figure 32:
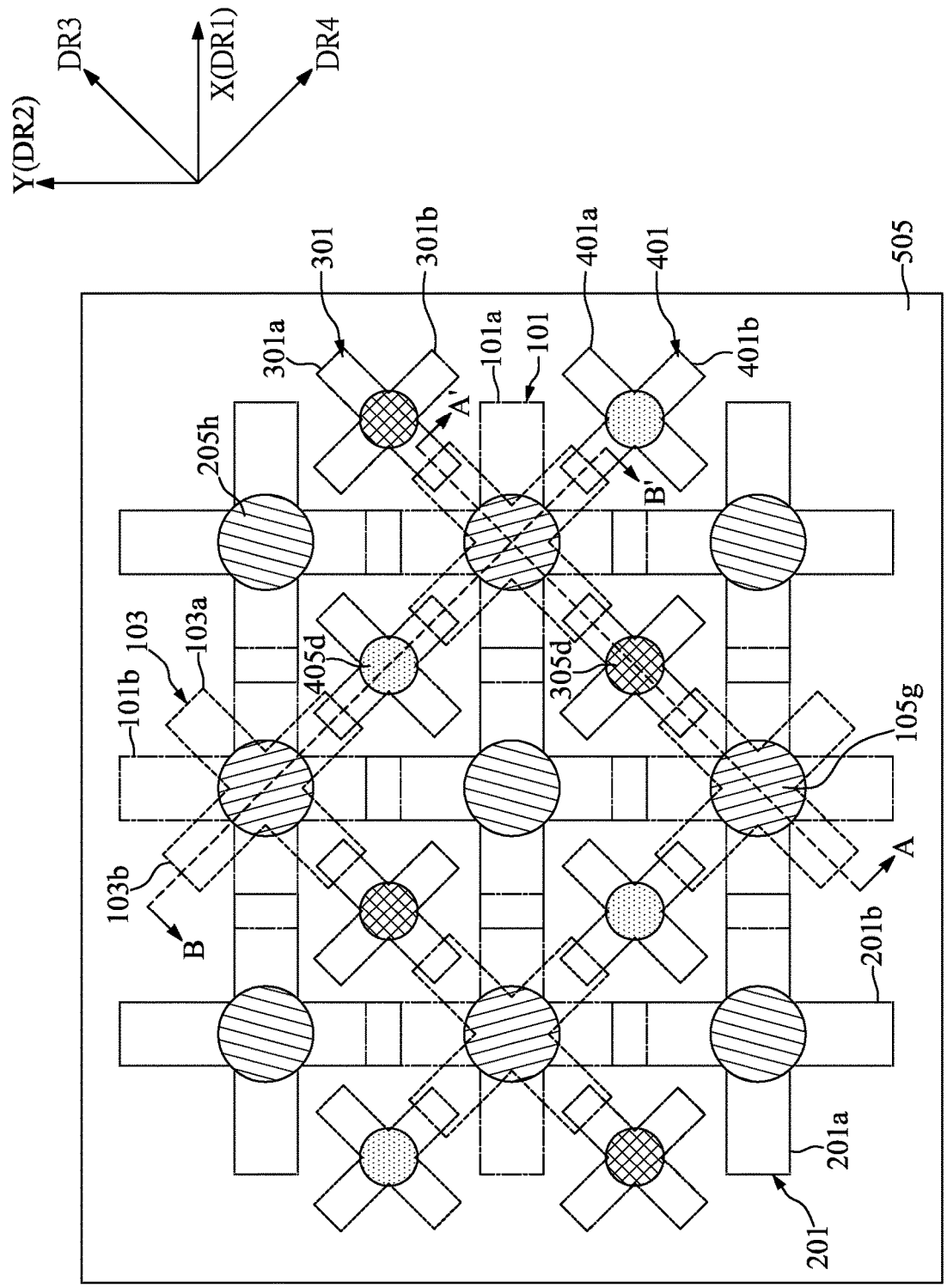
FIG. 32 illustrates, in a schematic top-view diagram, part of the flow for fabricating the semiconductor device in accordance with another embodiment of the present disclosure.
Figure 33:
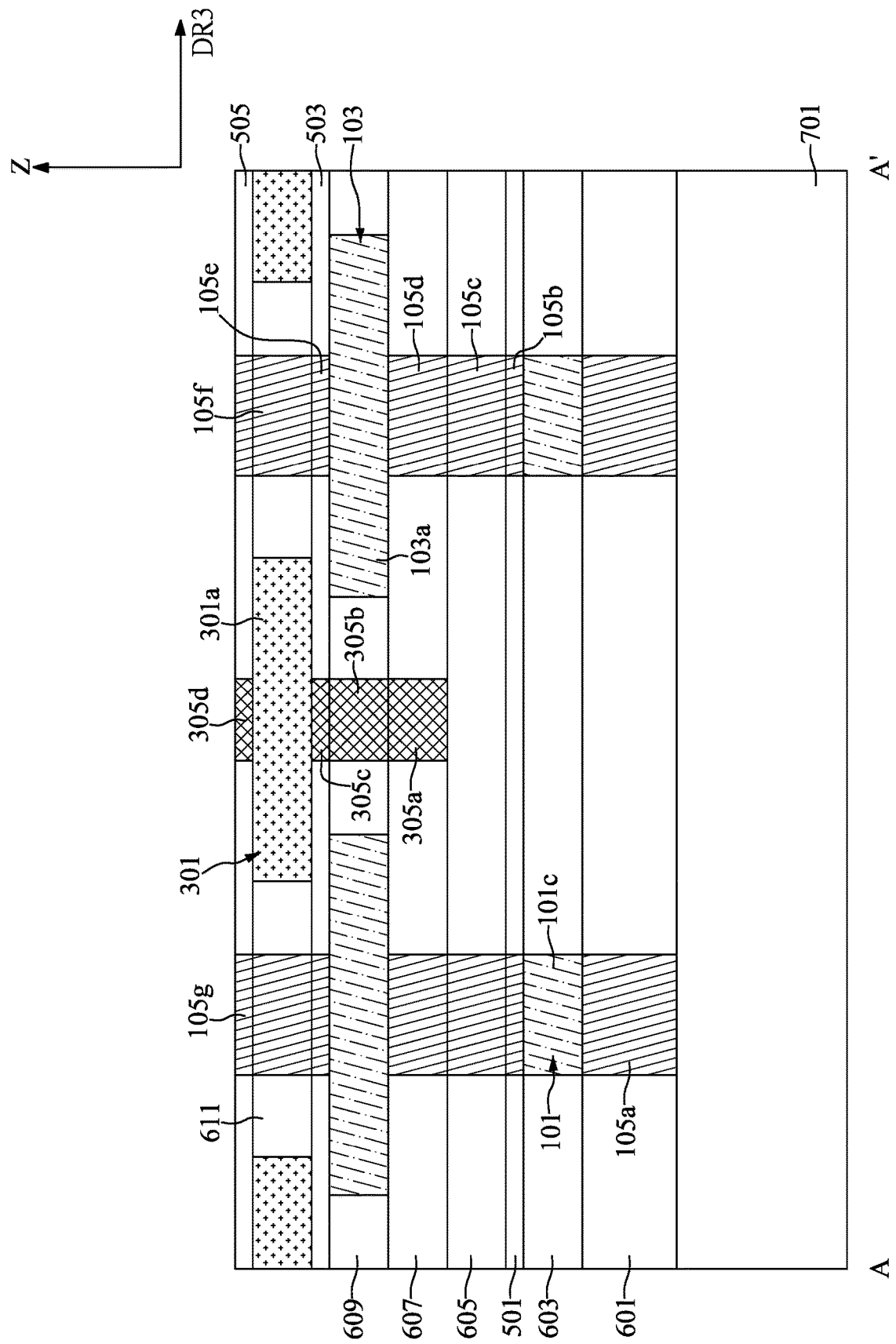
FIGS. 33 and 34 are schematic cross-sectional view diagrams respectively taken along lines A-A' and B-B' in FIG. 32.
Figure 34:
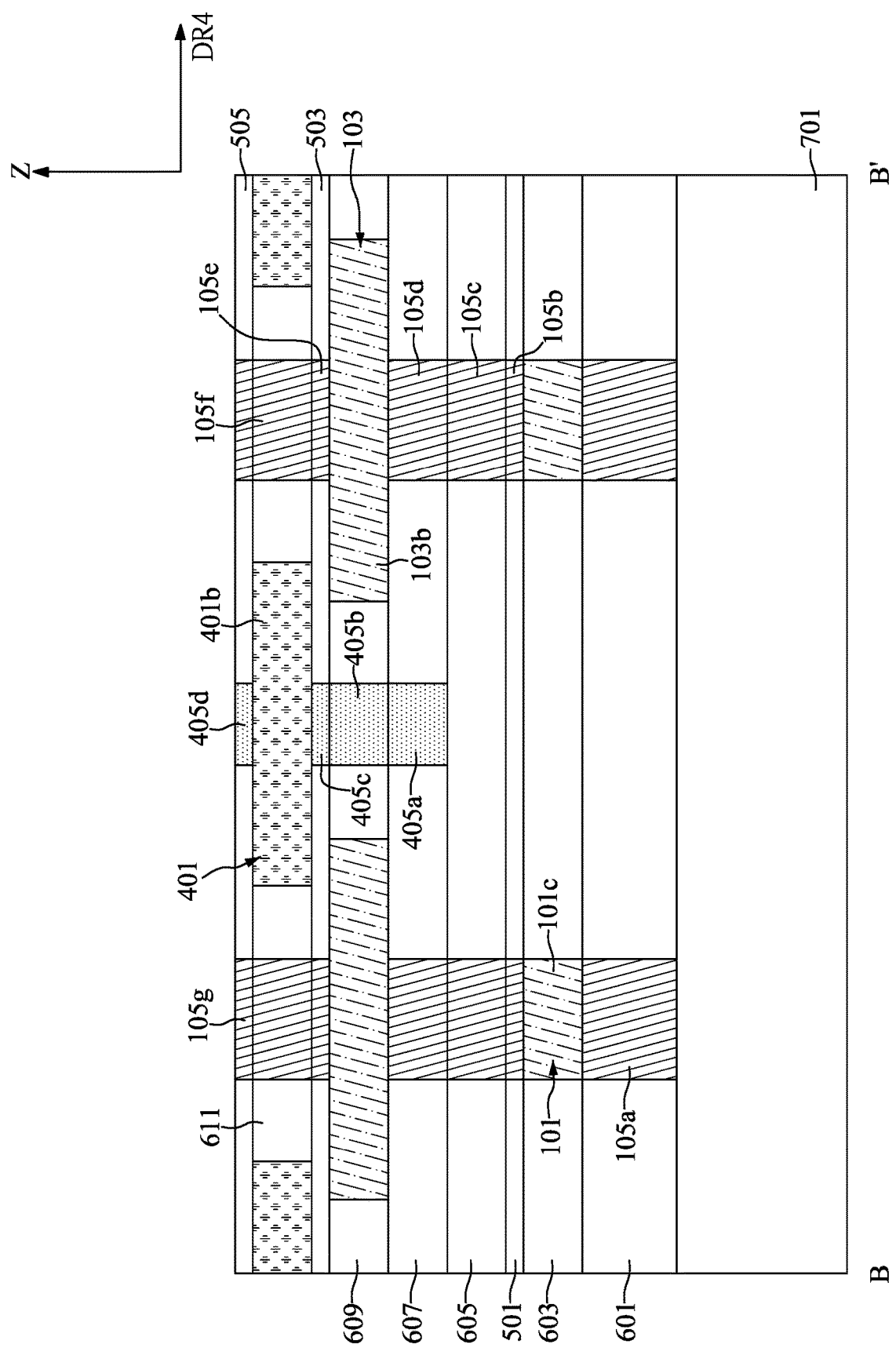
Figure 35:
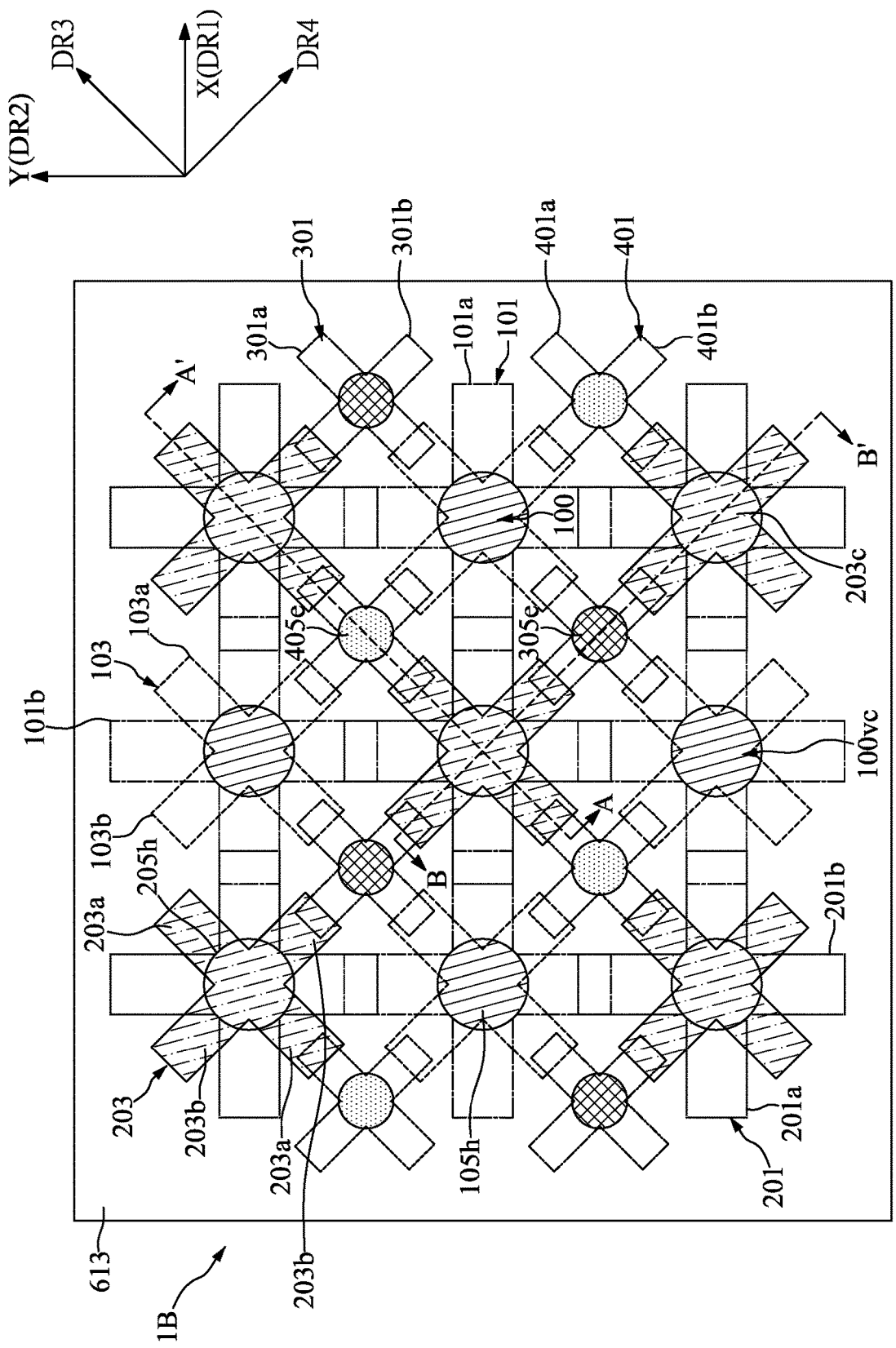
FIG. 35 illustrates, in a schematic top-view diagram, part of the flow for fabricating the semiconductor device in accordance with another embodiment of the present disclosure.
Figure 36:
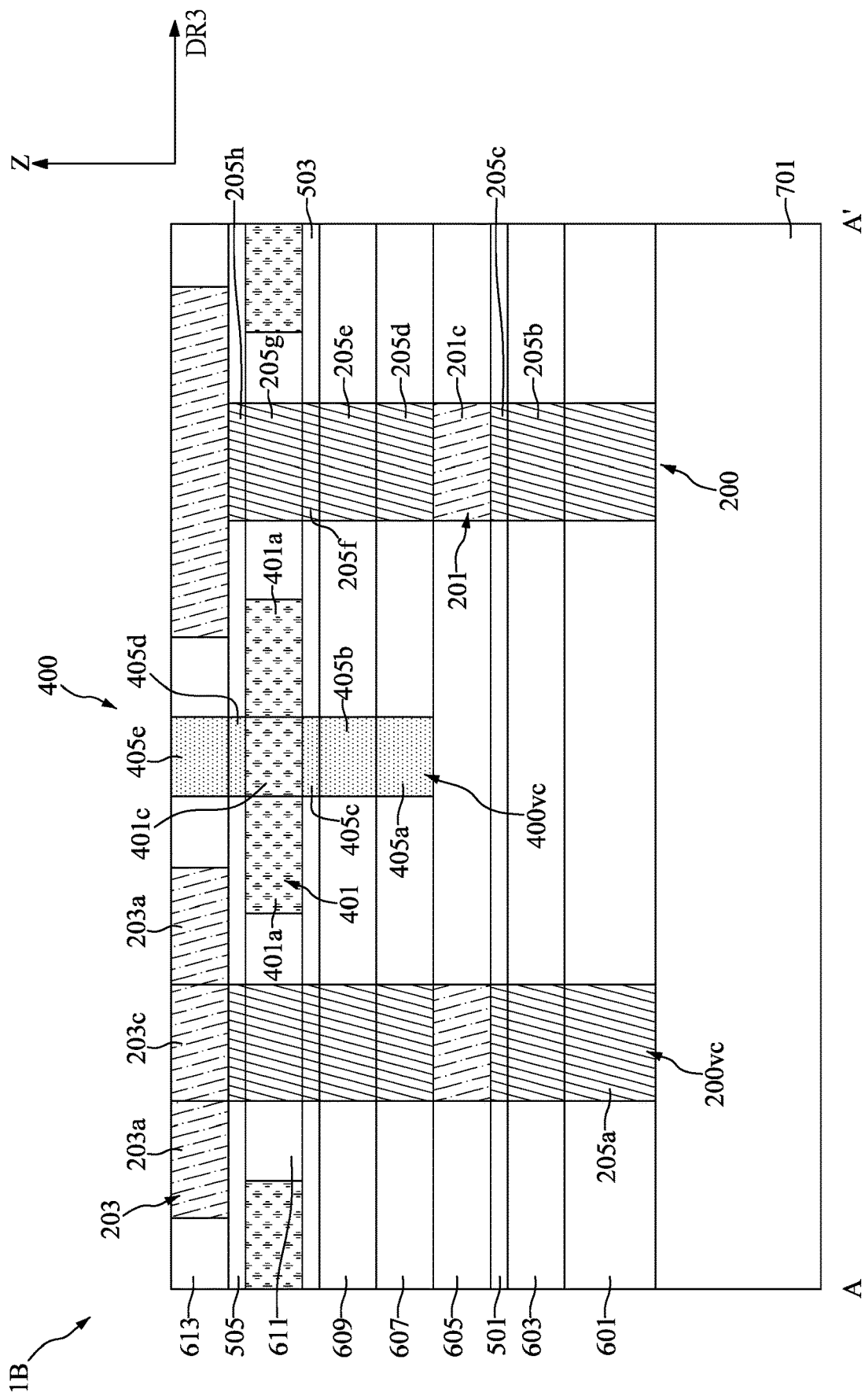
FIGS. 36 and 37 are schematic cross-sectional view diagrams respectively taken along lines A-A' and B-B' in FIG. 35.
Figure 37:
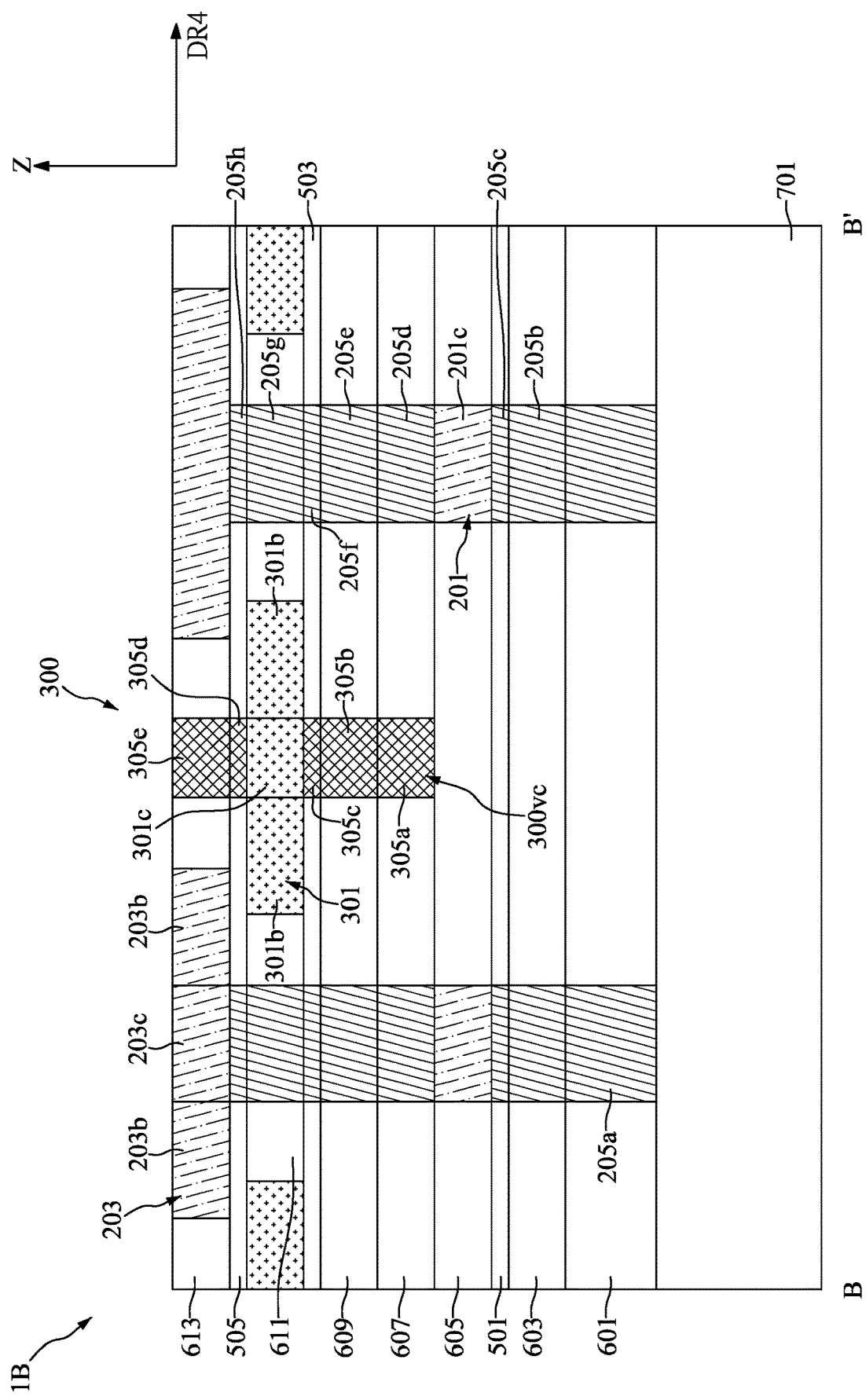

FIG. 32 illustrates, in a schematic top-view diagram, part of the flow for fabricating the semiconductor device 1B in accordance with another embodiment of the present disclosure. FIGS. 33 and 34 are schematic cross-sectional view diagrams respectively taken along lines A-A' and B-B' in FIG. 32. FIG. 35 illustrates, in a schematic top-view diagram, part of the flow for fabricating the semiconductor device 1B in accordance with another embodiment of the present disclosure. FIGS. 36 and 37 are schematic cross-sectional view diagrams respectively taken along lines A-A' and B-B' in FIG. 35.

With reference to FIG. 9 and FIGS. 32 to 37, at step S19, a third insulation layer 505 may be formed to cover the plurality of first middle branch units 301 and the plurality of second middle branch units 401, and a plurality of second top branch units 203 may be formed on the third insulation layer 505, electrically coupled to the plurality of second bottom branch units 201, and partially overlapped with the plurality of first middle branch units 301 and the plurality of second middle branch units 401.

With reference to FIGS. 32 to 34, a third insulation layer 505 may be formed on the dielectric layer 611 to cover the first connection vias 105f, the second connection vias 205g, the first middle branch units 301, and the second middle branch units 401. The third insulation layer 505 may have a structure similar to the first insulation layer 501, and descriptions thereof are not repeated herein. In some embodiments, the third insulation layer 505 may be an etch stop layer and may be easily integrated into middle-end-of line process or back-end-of-line process.

With reference to FIGS. 32 to 34, a first connection vias 105g may be respectively correspondingly formed on the first connection vias 105f. A plurality of second connection vias 205h may be respectively correspondingly formed on the second connection vias 205g. A plurality of third connection vias 305d may be respectively correspondingly formed on the center plates 301c of the first middle branch units 301. A plurality of fourth connection vias 405d may be respectively correspondingly formed on the center plates 401c of the second middle branch units 401.

With reference to FIGS. 35 to 37, a dielectric layer 613 may be formed on the dielectric layer 611 to cover the first connection vias 105g, the second connection vias 205h, the third connection vias 305d, and the fourth connection vias 405d. A plurality of first connection vias 105h may be respectively correspondingly formed on the first connection vias 105g and in the dielectric layer 613. A plurality of third connection vias 305e may be respectively correspondingly formed on the third connection vias 305d and in the dielectric layer 613. The plurality of fourth connection vias 405e may be respectively correspondingly formed on the fourth connection vias 405d and in the dielectric layer 613.

The first connection vias 105a, 105b, 105c, 105d, 105e, 105f, 105g, 105h, the center plate 101c, and the center plate 103c together configure a first vertical column 100vc. The first vertical column 100vc, the first set of bottom plates 101a, the second set of bottom plates 101b, the first set of top plates 103a, and the second set of top plates 103b together configure a first electrode 100. The third connection vias 305a, 305b, 305c, 305d, 305e and the center plate 301c together configure a third vertical column 300vc. The third vertical column 300vc, the first set of middle plates 301a, and the second set of middle plates 301b together configure a third electrode 300. The fourth connection vias 405a, 405b, 405c, 405d, 405e and the center plate 401c together configure a fourth vertical column 400vc. The fourth vertical column 400vc, the first set of middle plates 401a, and the second set of middle plates 401b together configure a fourth electrode 400.

With reference to FIGS. 35 to 37, a plurality of second top branch units 203 may be respectively correspondingly formed on the second connection vias 205h and in the dielectric layer 613. For brevity, clarity, and convenience of description, only one second top branch unit 203 is described.

The second top branch unit 203 may be formed at a fifth vertical level higher than the fourth vertical level. The second top branch unit 203 may include a center plate 203c, a first set of top plates 203a, and a second set of top plates 203b. The center plate 203c may be formed on the second connection via 205h. The center plate 203c may have a structure similar to the center plate 101c, and descriptions thereof are not repeated herein.

The first set of top plates 203a may be formed extending from two sides of the center plate 203c and parallel to the direction of the first set of middle plates 401a of the second middle branch unit 401. In other words, the first set of top plates 203a may be extending along the third direction DR3. The second set of top plates 203b may be formed extending from other two sides of the center plate 203c and parallel to the direction of the second set of middle plates 301b of the first middle branch unit 301. In other words, the second set of top plates 203b may be extending along the fourth direction DR4. The first set of top plates 203a and the second set of top plates 203b may be intersected at the center plate 203c.

With reference to FIGS. 35 to 37, the first set of top plates 203a of the second top branch unit 203 and the first set of middle plates 401a of the second middle branch unit 401 may be partially overlapped in a top-view perspective. The third insulation layer 505 is disposed between the first set of top plates 203a and the first set of middle plates 401a in a cross-sectional perspective. The third insulation layer 505 and the overlapped first set of top plates 203a of the second top branch unit 203 and first set of middle plates 401a of the second middle branch unit 401 together configure another programmable structure.

The second set of top plates 203b of the second top branch unit 203 and the second set of middle plates 301b of the first middle branch unit 301 may be partially overlapped in a top-view perspective. The third insulation layer 505 is disposed between the second set of top plates 203b and the second set of middle plates 301b in a cross-sectional perspective. The third insulation layer 505 and the overlapped second set of top plates 203b of the second top branch unit 203 and second set of middle plates 301b of the first middle branch unit 301 together configure another programmable structure.

The second connection vias 205a, 205b, 205c, 205d, 205e, 205f, 205g, 205h, the center plate 201c, and the center plate 203c together configure a second vertical column 200vc. The second vertical column 200vc, the first set of bottom plates 201a, the second set of bottom plates 201b, the first set of top plates 203a, and the second set of top plates 203b together configure a second electrode 200.

With reference to FIGS. 18, 19, 36, and 37, in a perspective of the first electrode 100, each side of the first set of bottom plates 101a, the second set of bottom plates 101b, the first set of top plates 103a, and the second set of top plates 103b has two programming states ("On" or "Off"). Therefore, total 256 (i.e., 2^8) possible configurations may be employed for the first electrode 100. For example, while programming a selected side of a selected electrode 100, a programming voltage may be applied to the selected electrode and all other electrodes may be grounded. The procedure of programming may be similar to that illustrated in FIG. 8, and descriptions thereof are not repeated herein.

With the teaching of the embodiments of the semiconductor device 1A and the semiconductor device 1B, it should be appreciated that some of bottom branch units, middle branch unit, and top branch unit or some of the bottom plates, middle plates, and top plates may be selectively omitted depending on the design demand. For example, the first top branch unit 103 may be omitted. The remained second set of top plates 203b and the first middle branch unit 301 or the second middle branch unit 401 may be served as capacitors.

In addition, sets of plates of a branch unit (e.g., the first set of bottom plates 101a and the second set of bottom plates 101b of the first bottom branch unit 101) may be formed at different vertical level with an insulation layer (e.g., the first insulation layer 501) formed between the sets of plates. In some embodiments, the sets of plates may be extended along different directions.

Due to the design of the semiconductor device of the present disclosure, each electrode may provide multiple programmable configurations within limited wafer area. As a result, the real estate of the semiconductor device 1A/1B may be saved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first electrode comprising:
a first vertical column; and
a first bottom branch unit positioned at a first vertical level and comprising a first set of bottom plates extending from two opposing sides of the first vertical column and parallel to a first direction;
two second electrodes disposed at two sides of the first electrode and respectively comprising:
a second vertical column; and
a second bottom branch unit positioned at a second vertical level higher than the first vertical level and comprising a first set of bottom plates extending from two opposing sides of the second vertical column and parallel to the first direction; and
a first insulation layer positioned between the first bottom branch unit and the second bottom branch unit;
wherein the first set of bottom plates of the first bottom branch unit and the first set of bottom plates of the second bottom branch unit are partially overlapped in a top-view perspective;
wherein the first electrode, the first insulation layer, and the second electrode together configure a programmable structure.

2. The semiconductor device of claim 1, wherein the first vertical column comprises a plurality of first connection vias and a center plate of the first bottom branch unit stacked vertically, and the first set of bottom plates of the first bottom branch unit are extending from the center plate of the first bottom branch unit.

3. The semiconductor device of claim 2, wherein a shape of the center plate of the first bottom branch unit is triangle, square, rectangular, polygon, circle, or oval in a top-view perspective.

4. The semiconductor device of claim 3, wherein the first insulation layer is an etch stop layer.

5. The semiconductor device of claim 3, wherein the first set of bottom plates comprises tungsten, cobalt, zirconium, tantalum, titanium, aluminum, ruthenium, copper, metal carbides, metal nitrides, transition metal aluminides, or a combination thereof.

6. The semiconductor device of claim 5, wherein the first insulation layer comprises silicon oxide, silicon nitride, silicon oxynitride, silicon nitride oxide, or a combination thereof.

7. A semiconductor device, comprising:
two first electrodes diagonally arranged and respectively comprising a first vertical column and a first bottom branch unit positioned at a first vertical level and comprising a first set of bottom plates extending from two opposing sides of the first vertical column and parallel to a first direction and a second set of bottom plates extending from other two opposing sides of the first vertical column and parallel to a second direction perpendicular to the first direction;
two second electrode diagonally arranged and respectively comprising a second vertical column and a second bottom branch unit positioned at a second vertical level higher than the first vertical level and comprising a first set of bottom plates extending from two opposing sides of the second vertical column and parallel to the first direction and a second set of bottom plates extending from other two opposing sides of the second vertical column and parallel to the second direction, wherein the first sets of bottom plates of the first bottom branch unit and the second bottom branch unit are partially overlapped in a top-view perspective, and the second sets of bottom plates of the first bottom branch unit and the second bottom branch unit are partially overlapped in the top-view perspective; and
a first insulation layer positioned between the first bottom branch unit and the second bottom branch unit;
wherein the first electrode, the second electrode, and the first insulation layer together configure a programmable structure.

8. The semiconductor device of claim 7, wherein the two first electrodes respectively comprise a first top branch unit positioned at a third vertical level higher than the second vertical level and comprising:
a first set of top plates extending from other two opposing sides of the first vertical column and parallel to a third direction slanted with respective to the first direction and the second direction; and
a second set of top plates extending from other two opposing sides of the first vertical column and parallel to a fourth direction perpendicular to the third direction.

9. The semiconductor device of claim 8, further comprising a third electrode and a second insulation layer, wherein the third electrode comprises a third vertical column and a first middle branch unit positioned at a fourth vertical level and comprising:
a first set of middle plates extending from two opposing sides of the third vertical column and parallel to the third direction;
wherein the fourth vertical level is higher than the third vertical level;
wherein the first set of middle plates of the first middle branch unit and the first set of top plates of the first top branch unit are partially overlapped in the top-view perspective;
wherein the second insulation layer is positioned between the first top branch unit and the first middle branch unit.

10. The semiconductor device of claim 9, wherein the first middle branch unit comprises a second set of middle plates extending from other two opposing sides of the third vertical column and parallel to the fourth direction.

11. The semiconductor device of claim 10, further comprising a third insulation layer, wherein the two second electrodes respectively comprise a second top branch unit positioned at a fifth vertical level and comprising:
a first set of top plates extending from other two opposing sides of the second vertical column and parallel to the third direction; and
a second set of top plates extending from other two opposing sides of the second vertical column and parallel to the fourth direction;
wherein the fifth vertical level is higher than the fourth vertical level;
wherein the second set of top plates of the second top branch unit and the second set of middle plates of the first middle branch unit are partially overlapped in the top-view perspective;
wherein the third insulation layer is positioned between the second top branch unit and the first middle branch unit.

12. The semiconductor device of claim 11, further comprising a fourth electrode comprising a fourth vertical column and a second middle branch unit positioned at a same vertical level as the first middle branch unit and comprising:
a first set of middle plates extending from two opposing sides of the fourth vertical column and parallel to the third direction;
wherein the first set of middle plates of the second middle branch unit and the first set of top plates of the second top branch unit are partially overlapped in the top-view perspective;
wherein the third insulation layer is positioned between the second top branch unit and the second middle branch unit.

13. The semiconductor device of claim 12, wherein the second middle branch unit comprises a second set of middle plates extending from other two opposing sides of the fourth vertical column and parallel to the fourth direction, wherein the second set of middle plates of the second middle branch unit and the second set of top plates of the first top branch unit are partially overlapped in the top-view perspective, wherein the second insulation layer is positioned between the first top branch unit and the second middle branch unit.

14. The semiconductor device of claim 7, wherein a bottom surface of the second vertical column contacts a substrate.

15. The semiconductor device of claim 9, wherein a bottom surface of the third vertical column is at a vertical level higher than a vertical level of a bottom surface of the first vertical column.

16. The semiconductor device of claim 9, wherein a bottom surface of the third vertical column contacts a substrate.

17. A method for fabricating a semiconductor device, comprising:
forming a plurality of first bottom branch units at a first vertical level and respectively comprising:
a first vertical column; and
a first set of bottom plates extending from two sides of the first vertical column and parallel to a first direction;
forming a first insulation layer to cover the plurality of first bottom branch unit; and
forming a plurality of second bottom branch units on the first insulation layer, at a second vertical higher than the first vertical level, and respectively comprising:

a second vertical column; and a first set of bottom plates extending from two sides of the second vertical column, parallel to the first direction, and partially overlapped with the first set of bottom plates of the first bottom branch unit in a top-view perspective to configure a programmable structure.

18. The method for fabricating the semiconductor device of claim 17, wherein the plurality of first bottom branch units respectively comprise:

a second set of bottom plates extending from other two sides of the first vertical column and parallel to a second direction perpendicular to the first direction; and wherein the plurality of second bottom branch units respectively comprise:

a second set of bottom plates extending from other two sides of the second vertical column, parallel to the second direction, and partially overlapped with the second set of bottom plates of the first bottom branch unit in the top-view perspective to configure another programmable structure.

19. The method for fabricating the semiconductor device of claim 17, further comprising:

forming a plurality of first top branch units above the plurality of first bottom branch units, at a third vertical level higher than the second vertical level, electrically coupled to the plurality of the first bottom branch units, and respectively comprising:

a first set of top plates extending from other two sides of the first vertical column and parallel to a third direction slanted with respect to the first direction.

20. The method for fabricating the semiconductor device of claim 19, further comprising:

forming a second insulation layer to cover the plurality of first top branch units; and forming a plurality of first middle branch units on the second insulation layer, at a fourth vertical level higher than the third vertical level, and respectively comprising:

a third vertical column; and a first set of middle plates extending from two sides of the third vertical column, parallel to the third direction, and partially overlapped with the first set of top plates of the first top branch unit in the top-view perspective to configure another programmable structure.

* * * * *